US008692455B2

(12) United States Patent
Hayashi et al.

(10) Patent No.: US 8,692,455 B2
(45) Date of Patent: Apr. 8, 2014

(54) DISPLAY DEVICE AND METHOD FOR PRODUCTION THEREOF

(75) Inventors: Naoki Hayashi, Kanagawa (JP);
Yasunobu Hiromasu, Kanagawa (JP);
Hirofumi Fujioka, Kanagawa (JP)

(73) Assignee: Sony Corporation, Tokyo (JP)

( * ) Notice: Subject to any disclaimer, the term of this patent is extended or adjusted under 35 U.S.C. 154(b) by 279 days.

(21) Appl. No.: 12/330,194

(22) Filed: Dec. 8, 2008

(65) Prior Publication Data

US 2009/0153046 A1   Jun. 18, 2009

(30) Foreign Application Priority Data

Dec. 18, 2007  (JP) .................................. 2007-326595
May 9, 2008  (JP) .................................. 2008-123004

(51) Int. Cl.
*H05B 33/26* (2006.01)

(52) U.S. Cl.
USPC .......................................... 313/506; 313/504

(58) Field of Classification Search
USPC ................................................. 313/504, 506
See application file for complete search history.

(56) References Cited

U.S. PATENT DOCUMENTS

| 2005/0008894 A1* | 1/2005 | Hiruma et al. ................ 428/690 |
| 2005/0206308 A1* | 9/2005 | Takahashi et al. ............ 313/504 |
| 2007/0120785 A1* | 5/2007 | Kimura ........................... 345/82 |

FOREIGN PATENT DOCUMENTS

| CN | 1812119 | 8/2006 |
| JP | 2002-318556 | 10/2002 |
| JP | 2004-071365 | 3/2004 |
| JP | 2005-011810 | 1/2005 |
| JP | 2006-113571 | 4/2006 |
| JP | 2007-141844 | 6/2007 |
| JP | 2007-287354 | 11/2007 |
| JP | 2009-124108 | 6/2009 |
| WO | WO2007148540 | 12/2007 |

OTHER PUBLICATIONS

Machine Translation of Fujioka et al. WO 2007/148540.*
Japanese Patent Office Action corresponding to Japanese Serial No. 2008-123004 dated Mar. 18, 2010.
Japanese Patent Office Action corresponding to Japanese Serial No. 2008-123004 dated Jun. 1, 2010.

* cited by examiner

*Primary Examiner* — Anh T. Mai
*Assistant Examiner* — Andrew Coughlin
(74) *Attorney, Agent, or Firm* — Dentons US LLP

(57) ABSTRACT

A display device having a plurality of driving elements and wiring parts electrically connected to the driving parts, the display device includes: a plurality of first electrodes which are formed in correspondence to each driving element on the driving elements and the wiring parts; a plurality of light-emitting parts which are each formed on the first electrodes; a common second electrode which is formed from a material that transmits light from the light-emitting part and is formed on the light-emitting parts; auxiliary wiring parts with a lower resistance than the second electrodes; and contact parts which are formed in laminate structure from a plurality of conductive layers and which electrically connect the second electrodes and the auxiliary wirings with each other, with at least the lowermost conductive layer of the conductive layers of the contact parts being in direct contact with the second electrode.

13 Claims, 24 Drawing Sheets

FIG.5A
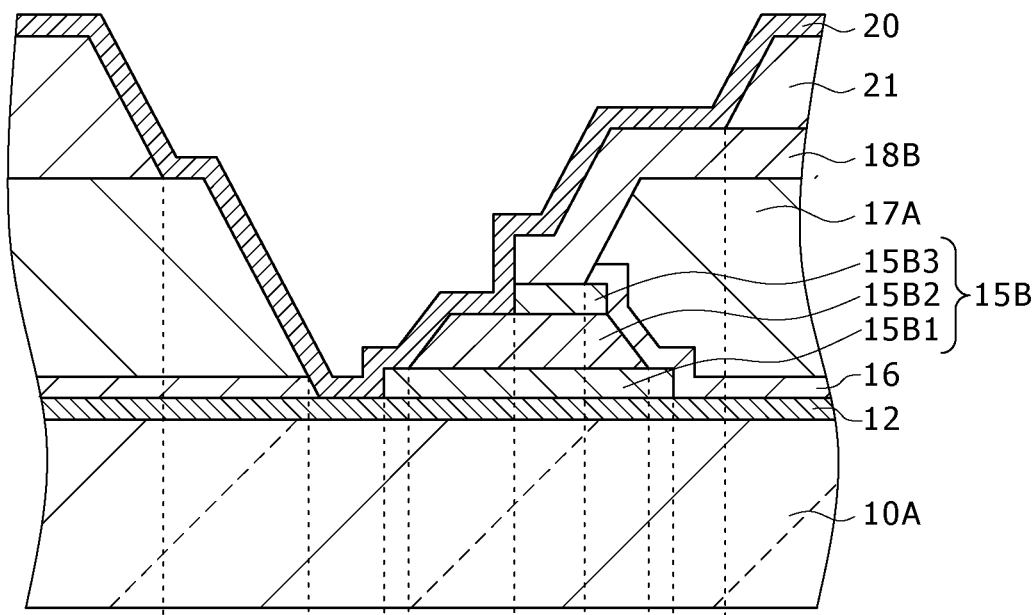
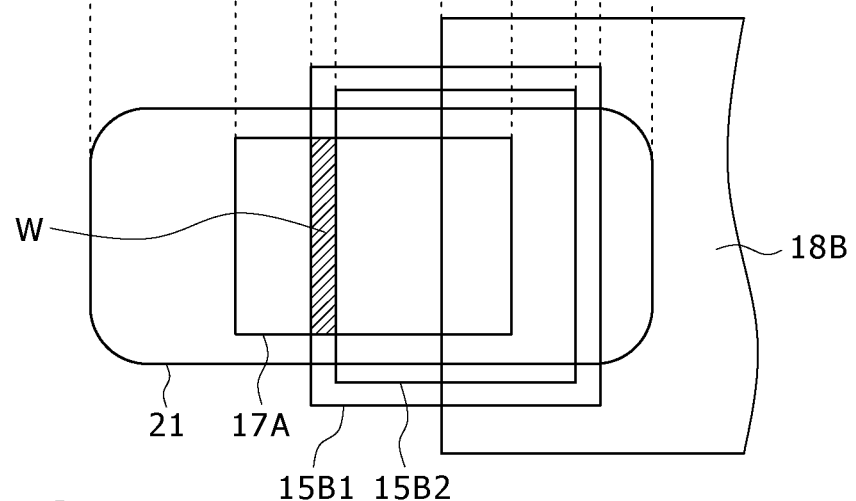
FIG.5B

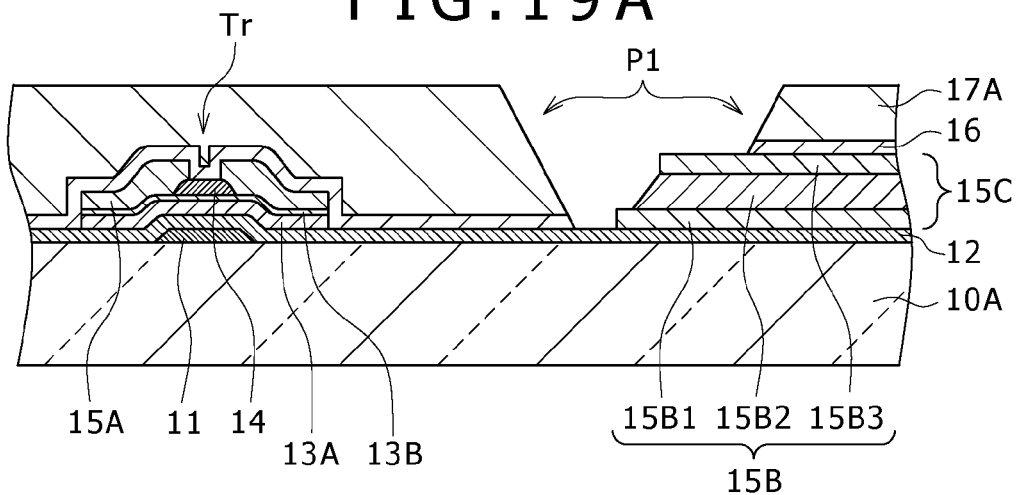
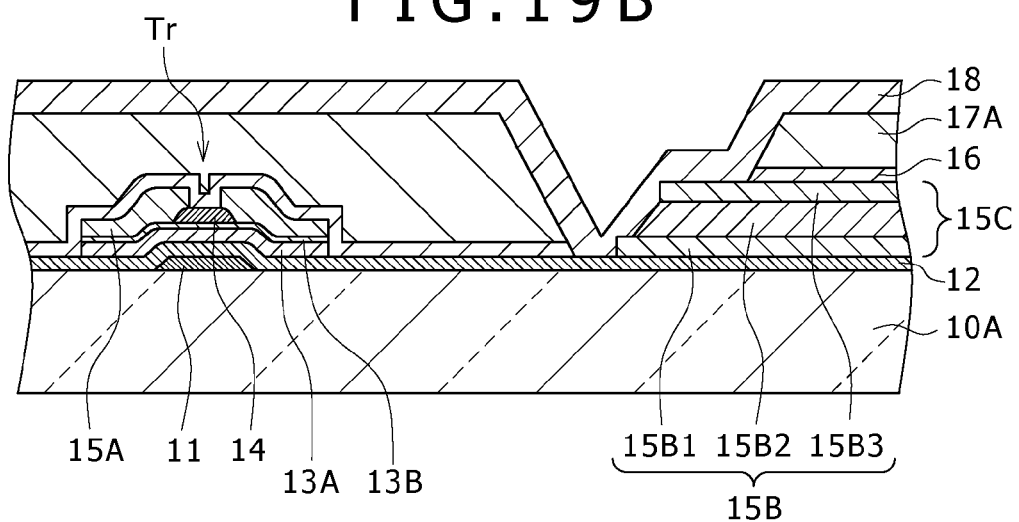
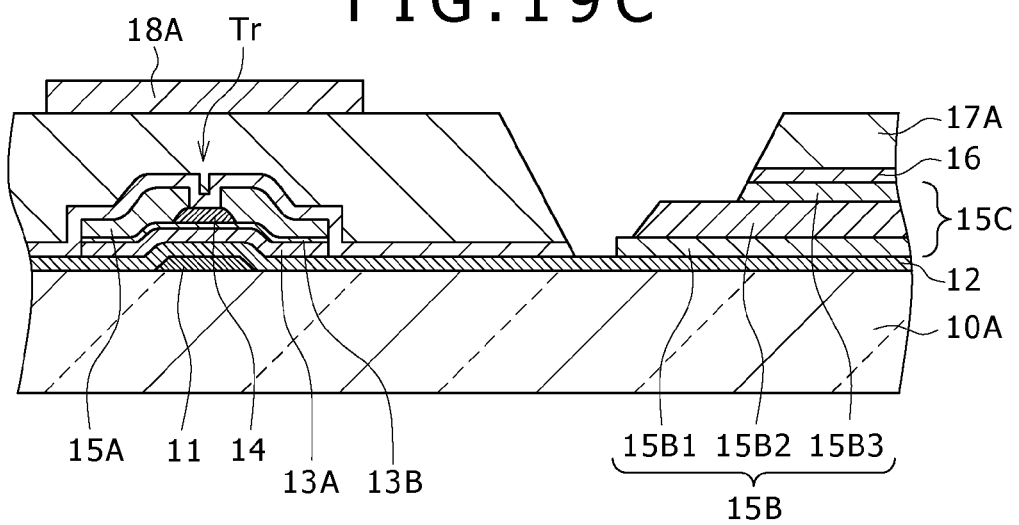

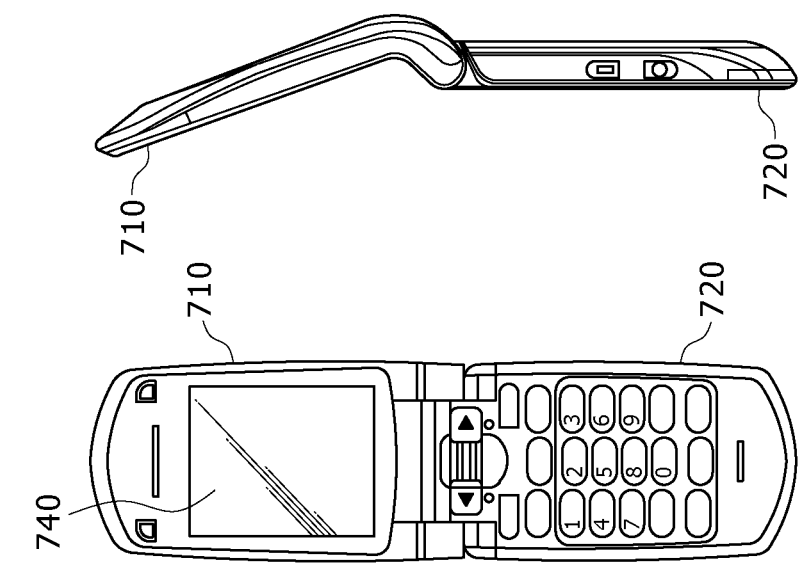
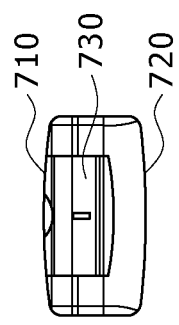
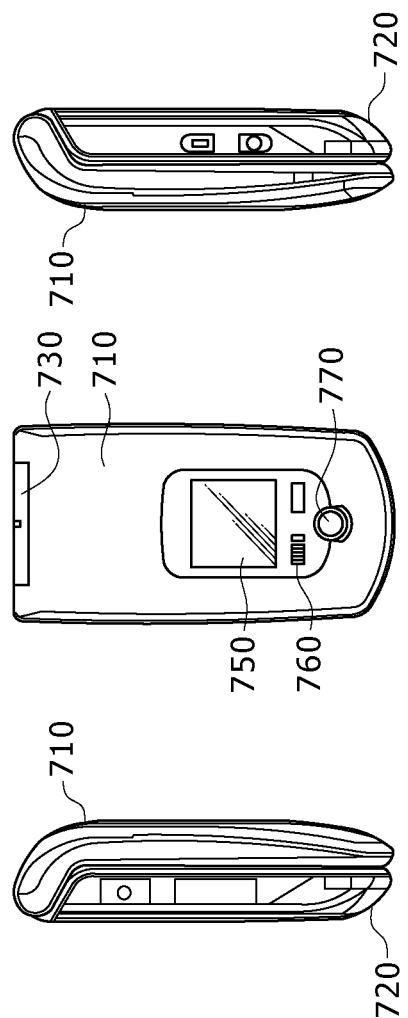
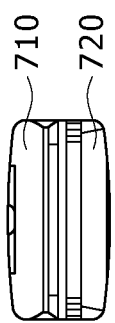

DISPLAY DEVICE AND METHOD FOR PRODUCTION THEREOF

CROSS REFERENCES TO RELATED APPLICATIONS

The present invention contains subject matter related to Japanese Patent Application JP 2008-123004, and JP 2007-326595, both filed in the Japan Patent Office on May 9, 2008, and on Dec. 18, 2007, respectively, the entire contents of which being incorporated herein by reference.

BACKGROUND OF THE INVENTION

1. Field of the Invention

The present invention relates to a display device of top emitting type and a method for production thereof.

2. Description of the Related Art

Among recent flat panel display devices attracting attention is the organic EL display device which displays images by means of organic EL (Electro Luminescence). The organic EL display device is a wide viewing angle and a low electric power consumption, the former being due to the fact that it utilizes emission from organic EL elements themselves. In addition, being highly responsive to high-definition high-speed video signals, the organic EL display device is expected to find practical use in the field of image technology. It is also attracting attention because it will find use as a flexible device if it is formed on a flexible plastic substrate that permits the organic emitting material to exhibit its inherent flexible properties.

The organic EL display device employs the driving system of either active matrix type or passive matrix type. The former, which employs TFT (Thin film Transistors) as driving elements, is superior to the latter in responsiveness and resolving power. Therefore, it is considered to be suitable particularly to the organic EL display device having the above-mentioned characteristics. The organic EL display device of active matrix type has organic EL elements (each including an organic emitting layer) and a driving panel on which are arranged driving elements (or TFT mentioned above) to drive the organic EL elements. To the driving panel is bonded (with an adhesive layer) a sealing panel so that they hold the organic elements between them. Each organic EL element has an organic emitting layer formed between a pair of electrodes.

The organic EL display device falls under bottom emission type and top emission type. The former permits each organic EL element to emit light through the driving panel mentioned above. The latter permits each organic EL elements to emit light through the sealing panel mentioned above. The latter is becoming the mainstream of development because of its larger aperture ratio.

Meanwhile, the organic EL display device of top emission type is constructed such that the electrodes on the sealing panel (through which light emerges) are common to every organic EL element. The electrodes are made of an optically transparent conductive material such as ITO (Indium Tin Oxide). Unfortunately, ITO has a higher resistivity than ordinary metallic materials by two to three orders of magnitude. The high resistivity causes the applied voltage to fluctuate over the electrode through which light emerges. This deteriorates the quality of display.

To tackle this problem, there has been proposed in Japanese Patent Laid-open No. 2002-318556 (hereinafter referred to as Patent Document 1) a technology to form an auxiliary wiring that connects with the electrode through which light emerges, the auxiliary wiring being formed at the same level as the electrode and from the same material as the electrode on the driving panel.

SUMMARY OF THE INVENTION

It would be possible to solve somewhat the above-mentioned problem with uneven voltage distribution within the electrode if an auxiliary wiring is formed from a material having a lower resistivity than the electrode through which light emerges and it is connected with the electrode through which light emerges.

However, the technology disclosed in Patent Document 1 mentioned above has the disadvantage that the auxiliary wiring made from the same material as the electrode is subject to surface oxidation if the electrode on the driving panel is made of aluminum or aluminum alloy. Surface oxidation results in an increased connecting resistance between the auxiliary wiring and the electrode through which light emerges and hence results in a large voltage drop across the oxidized part. This voltage drop in turn increases the power consumption of the device.

As mentioned above, the existing technology involves difficulties in avoiding increased power consumption without resorting to the auxiliary wiring and difficulties in improving the display quality by realizing even voltage distribution throughout the electrode through which light emerges.

The present embodiment was completed in view of the forgoing. It is desirable to provide a display device of top emitting type and a method for production thereof, the display device achieving low power consumption without resorting to auxiliary wiring and also having an improved display quality.

The present embodiment is directed to a display device having a plurality of driving elements and wiring parts electrically connected to the driving parts including a plurality of first electrodes which are formed in correspondence to each driving element on the driving elements and the wiring parts, a plurality of light-emitting parts which are each formed on the first electrodes, and a common second electrode which is formed from a material that transmits light from the light-emitting part and is formed on the light-emitting parts. The display device further includes auxiliary wiring parts with a lower resistance than the second electrodes, and contact parts which are formed in laminate structure from a plurality of conductive layers and which electrically connect the second electrodes and the auxiliary wirings with each other, with at least the lowermost conductive layer of the conductive layers of the contact parts being in direct contact with the second electrode.

The display device according to the present embodiment is constructed such that the second electrode and the auxiliary wiring are electrically connected to each other through the conductive contact part. The advantage of this structure is that even though the auxiliary wiring suffers surface oxidation, the contact resistance does not increase. Moreover, at least the lowermost conductive layer of the conductive layers of the contact part is in direct contact with the second electrode; therefore, even though the upper conductive layer suffers surface oxidation in the atmospheric air and electrical connection with the second electrode (through which light emerges) is impaired, good electrical connection is still maintained between the lower conductive layer and the electrode through which light emerges.

The present embodiment is directed also to a method for producing a display device including a step of forming on a substrate a plurality of driving elements and wiring parts such that these driving elements and wiring parts are electrically connected to each other, a step of forming a contact part having a laminate structure of a plurality of conductive layers, and a step of forming on the driving elements and the wiring parts a plurality of first electrodes corresponding respectively to the driving elements and also forming auxiliary wiring parts. The method further includes a step of forming light-emitting parts respectively on the first electrodes, and a step of forming on the light-emitting layers a common second electrode from a material that transmit light from each light-emitting part, with the auxiliary wiring being formed from a material having a lower resistance than the second electrode, and at least the lowermost conductive layer of the conductive layers of the contact parts being in direct contact with the second electrode.

The present embodiment is directly also to another method for producing a display device including a step of forming on a substrate a plurality of driving elements and wiring parts such that these driving elements and wiring parts are electrically connected to each other, a step of forming a contact part having a laminate structure of a plurality of conductive layers and integrally forming an auxiliary wiring part having the same laminate structure as the contact part, and a step of forming on the driving elements and the wiring parts a plurality of first electrodes corresponding respectively to the driving elements. The method further includes a step of forming light-emitting parts respectively on the first electrodes, and a step of forming on the light-emitting layers a common second electrode from a material that transmit light from each light-emitting part and electrically connecting between the second electrode and the auxiliary part through the contact part, with the auxiliary wiring being formed from a material having a lower resistance than the second electrode, and at least the lowermost conductive layer of the conductive layers of the contact parts being in direct contact with the second electrode.

The display device and the method for production thereof according to the present embodiment offer the following advantages. The second electrode and the auxiliary wiring are electrically connected to each other through the conductive contact part; therefore, even though the auxiliary wiring suffers surface oxidation, the contact resistance does not increase. Thus the display device ensures low power consumption and improved display device regardless of the structure of the auxiliary wiring.

The lowermost conductive layer of the contact part is electrically connected direct with the second electrode; even though the upper conductive layer suffers surface oxidation in the atmospheric air and electrical connection with the second electrode (through which light emerges) is impaired, good electrical connection is still maintained between the lower conductive layer and the electrode through which light emerges.

The wiring layer close to the driving elements is placed in the lower layer of the contact part, so that steps due to the planarized layer become smaller and the contact resistance decreases. Thus it is possible to improve yields without resorting to increasing the contact resistance.

BRIEF DESCRIPTION OF THE DRAWINGS

FIGS. 5A and 5B are sectional views showing the structure of the contact part in the display device shown in FIG. 3;

FIGS. 19A, 19B and 19C are sectional views showing steps that follow the steps shown in FIGS. 18A, 18B and 18C;

FIGS. 27A to 27G are respectively a front view (in open state), a side view (in open state), a front view (in closed state), a left side view, a right side view, a top view, and a bottom view of application example 5.

DETAILED DESCRIPTION OF THE PREFERRED EMBODIMENTS

The embodiments of the present invention will be described below with reference to the accompanying drawings.

The First Embodiment

Figure 1:
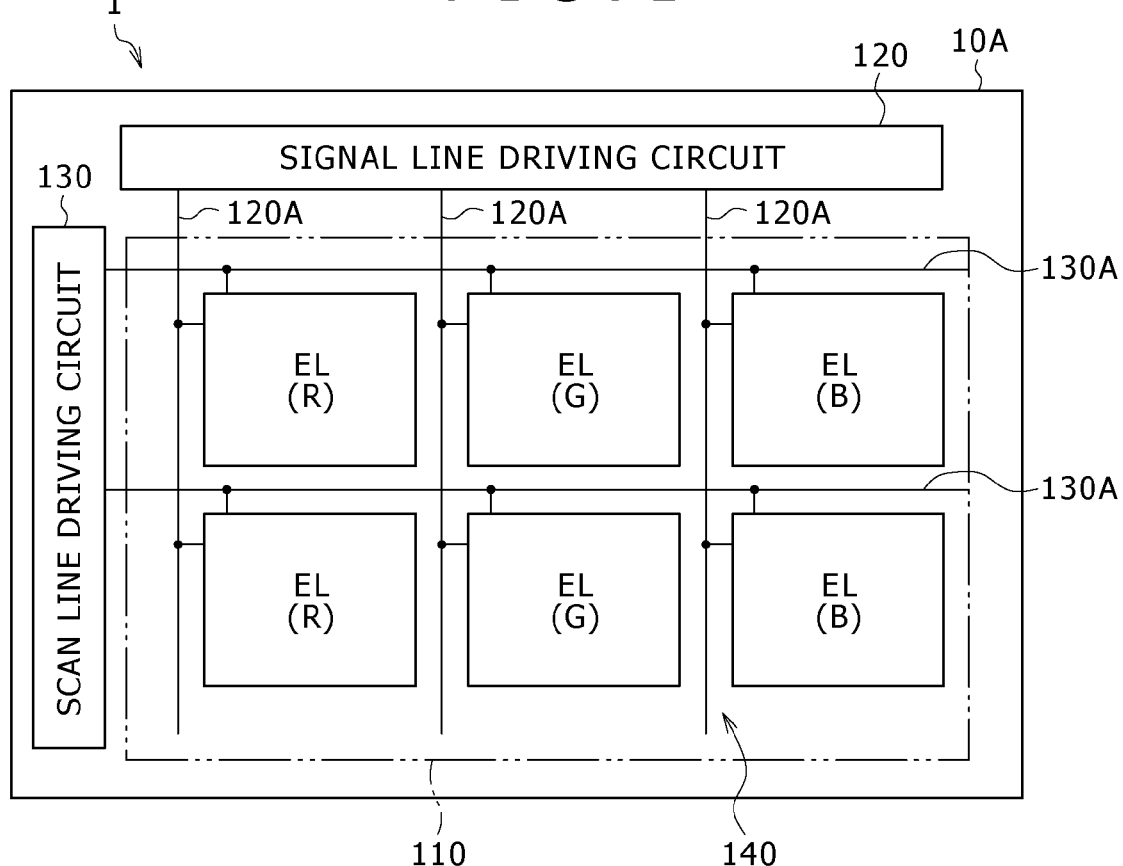
FIG. 1 is a diagram showing the structure of the display device pertaining to the first embodiment of the present invention.

FIG. 1 is a diagram showing the structure of the display device (organic EL display device) pertaining to the first embodiment of the present invention. The organic EL display device 1 is one which is used as an organic color display device of very thin type. It is composed of a transparent substrate 10A and a plurality of organic EL elements (EL) arranged thereon in a matrix pattern so as to form the display region 110. It also has a signal driving circuit 120 and a scan line driving circuit 130 (both for image display), which are formed along the sides of the display region 110.

Figure 2:
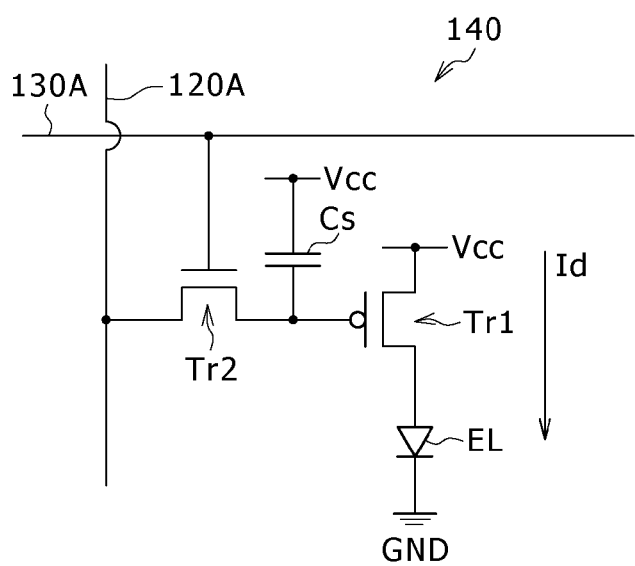
FIG. 2 is an equivalent circuit diagram showing one example of the pixel driving circuit shown in FIG. 1.

The display region 110 has the pixel driving circuit 140 formed therein. FIG. 2 is a diagram showing an example of the pixel driving circuit 140. The pixel driving circuit 140 is a driving circuit of active type, which is formed under the first electrode 18A (mentioned later) and is composed of a driving transistor Tr1, a writing transistor Tr2, a capacitor Cs (placed between the two transistors), and an organic EL element (EL) which is placed between a first source line (Vcc) and a second source line (GND) and is serially connected to the driving transistor Tr1. The driving transistor Tr1 and the writing transistor Tr2 are ordinary thin film transistors (TFT), which may be either of inverse stagger type (so-called bottom gate type) or stagger type (so-called top gate type).

The pixel driving circuit 140 has a plurality of signal lines 120A arranged in the column direction and a plurality of scan lines 130A arranged in the row direction. The intersection of each signal line 120A and each scan line 130A corresponds to a subpixel which is any one of the organic EL elements (EL). Each signal line 120A is connected to the signal line driving circuit 120, so that an image signal is delivered to the source electrode of the writing transistor Tr2 through the signal line 120A. Each scan line 130A is connected to the scan line driving circuit 130, so that scan signals are sequentially delivered to the gate electrode of the writing transistor Tr2 through the scan line 130A.

Figure 3:
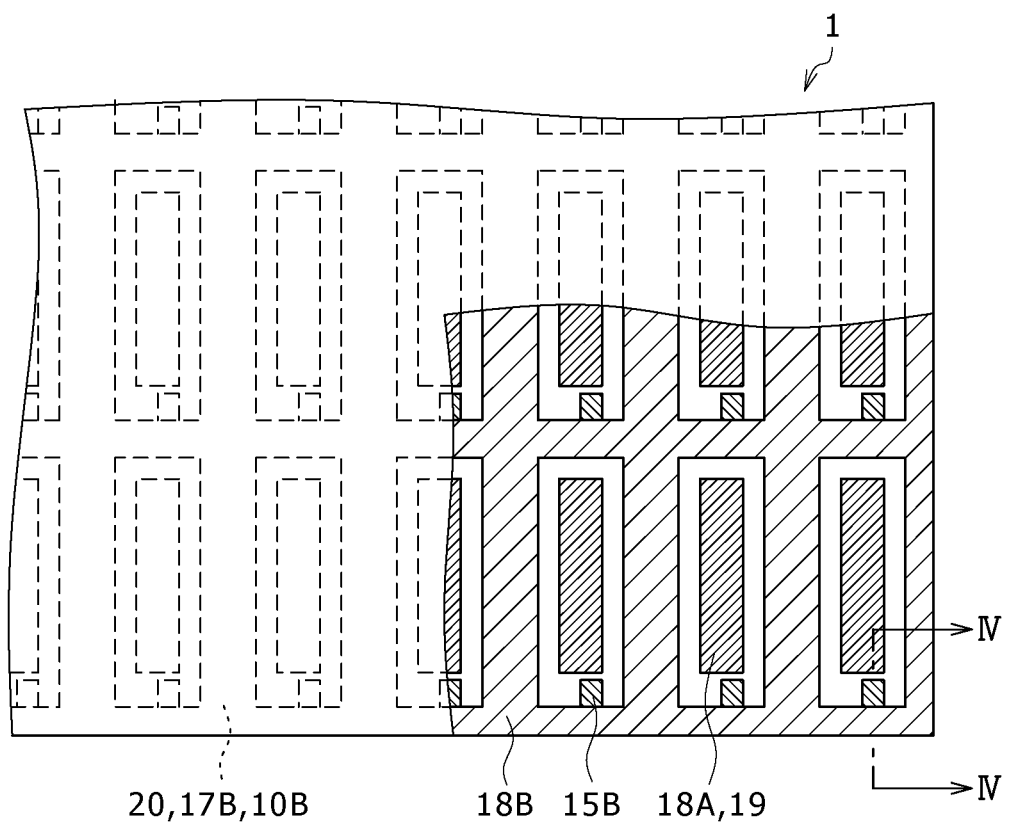
FIG. 3 is a plan view showing the structure of the display region shown in FIG. 1.
Figure 4:
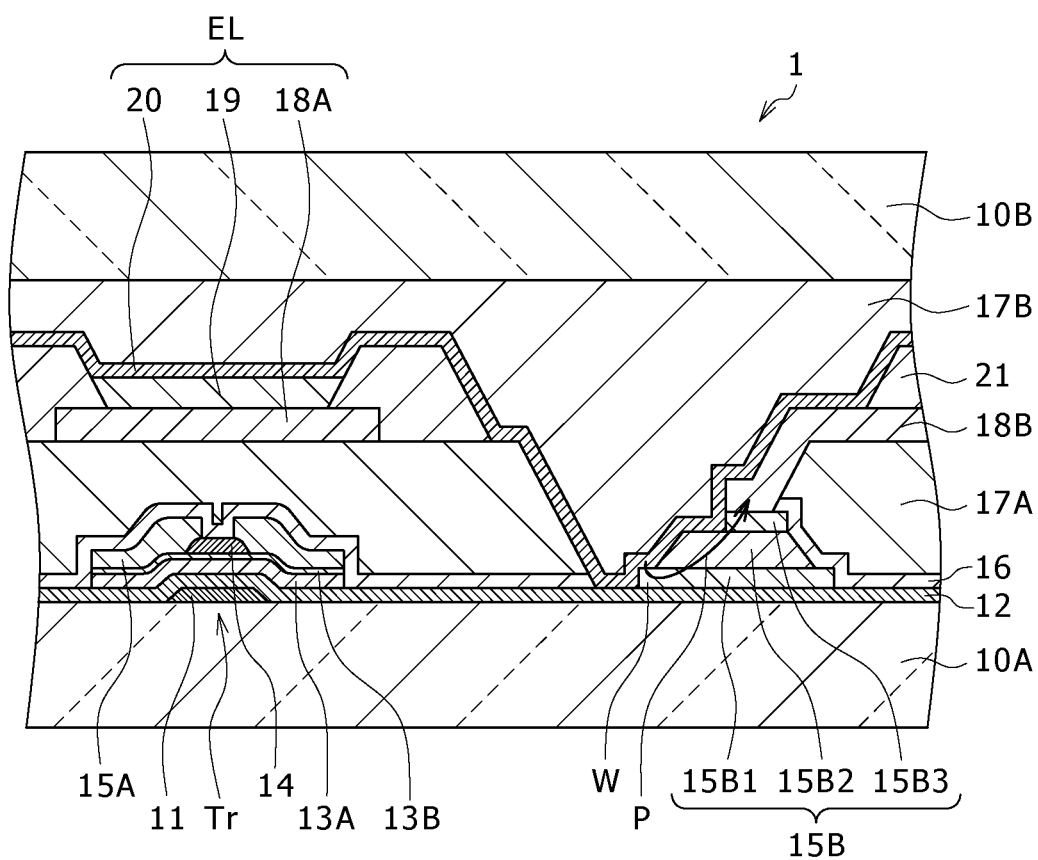
FIG. 4 is a sectional view taken along the line IV-IV in FIG. 3.

FIG. 3 is a diagram showing the plane structure of the display region 110 of the organic EL display device 1. FIG. 4 is a sectional view taken along the line IV-IV in FIG. 3.

The organic EL display device 1 is composed of a pair of insulating transparent substrates 10A and 10B and multi-layered films held between them. Specifically, the multi-layered films include a gate electrode 11, a gate insulating film 12, a silicon film 13A, a stopper insulating film 14, an n+-amorphous silicon film 13B, and a wiring layer 15A (source-drain electrodes), which are arranged upward. They constitute a thin film transistor Tr. On the thin film transistor Tr are placed an insulating protective film (passivation film) 16 and a planarized insulating film 17A on top of the other. On the planarized insulating film 17A is formed the organic EL element (EL) corresponding to the region in which the thin film transistor Tr is formed.

The transparent substrates 10A and 10B are formed from an insulating material such as glass or plastics.

The thin film transistor Tr is a driving element to drive each organic EL element (EL). The gate electrode 11 is formed from molybdenum (Mo) or the like, and the silicon film 13A constitutes the channel region of the thin film transistor Tr and it is formed from amorphous silicon film or the like.

The wiring layer 15A constitutes the source and drain electrodes of the thin film transistor Tr, and they function as the wiring such as signal line. The wiring layer 15A is formed from a metal or alloy, such as titanium (Ti), titanium nitride (TiN), aluminum (Al), molybdenum (Mo), tungsten (W), chromium (Cr), gold (Au), platinum (Pt), copper (Cu), silver (Ag), ITO (indium titanium oxide), and IZO (indium zinc oxide).

The wiring layer 15A may have a laminate structure, such as Mo/Al/Ti, Mo/AlSi alloy/Ti, Mo/(AlSiCu alloy/Ti, and Mo/(AlCe alloy)/Ti.

The protective insulating film 16 is intended to protect the thin film transistor Tr, and it is formed from at least one species of insulating materials such as $SiO_2$, SiN, and SiON. The planarized insulating film 17A makes the layer structure plane so that the organic EL element (EL) is formed thereon. It is formed from an insulting material such as photosensitive polyimide resin, polybenzoxasole resin, novolak resin, polyhydroxystyrene resin, and acrylic resin.

Each organic EL element (EL) is composed of the first electrode 18A, the organic light-emitting layer 19, and the second electrode 20, which are arranged downward to form a laminate structure. The first electrode 18A and the organic light-emitting layer 19 are separated from each other by the electrode insulating film 21 on the planarized insulating film 17A. As shown in FIG. 3, the organic EL elements (EL), each taking on a rectangular shape, are arranged in a matrix pattern between the transparent substrates 10A and 10B. The second electrode 20 is common to all of the organic EL elements (EL), and it is uniformly formed between the transparent substrates 10A and 10B, as shown in FIG. 4.

The first electrode 18A functions not only as an anode or cathode to apply voltage to the organic light-emitting layer 19 but also as a reflecting electrode to lead upward the light from the organic light-emitting layer 19. Therefore, the first electrode 18A is formed from a metal or alloy having a high reflectivity, such as Al, AlNd, and AlCe. Unfortunately, these materials are liable to surface oxidation.

The organic light-emitting layer 19 is composed of a hole transporting layer, a light-emitting layer, and an electron transporting layer (all not shown), which are sequentially deposited and held between the first electrode 18A and the second electrode 20. The light-emitting layer 19 emits light, upon application of a prescribed voltage across the first electrode 18A and the second electrode 20, through recombination of carriers (holes and electrons) injected thereinto.

The second electrode 20 also functions as an anode or cathode to apply voltage to the organic light-emitting layer 19. It is a transparent or translucent electrode that transmits light upward from the organic light-emitting layer 19. It is made of a transparent material (such as ITO and IZO) or a translucent material (such as MgAg alloy, Cu, Ag, Mg, and Al).

As shown in FIGS. 3 and 4, there is the auxiliary wiring 18B formed at the same level as the first electrode 18A in the region between the first electrodes 18A. It is electrically connected to the second electrode 20 so than uneven voltage distribution is eliminated from the second electrode 20, which is transparent and has a high resistance. Therefore, the auxiliary wiring 18B is formed from a material having a lower resistance than the second electrode 20 or the same material as used for the first electrode 18A.

The planarized insulating film 17A and the electrode insulating film 21 each have the tapered part (which opens upward) in a part of the region where the auxiliary wiring 18B is formed. Between the bottom of the tapered opening and the gate insulating film 12 is the conductive contact part 15B. The second electrode 20 and the auxiliary wiring 18B are electrically connected to each other above the contact part 15B.

The contact part 15B is formed from the same material as used for the wiring layer 15A at the same level as the wiring layer 15A. To be specific, the contact part 15B is formed from titanium (Ti), titanium nitride (TiN), aluminum (Al), molybdenum (Mo), tungsten (W), chromium (Cr), gold (Au), platinum (Pt), copper (Cu), ITO (indium tin oxide), IZO (indium zinc oxide), silver (Ag), or alloy thereof. The constituent of the contact part 15B may partly contain a conductive material that provides a good contact (preferably ohmic contact) with the second electrode 20.

As shown in FIGS. 5A and 5B, which is an enlarged view, the contact part 15B has a three-layered structure composed of the first to third conductive layers. The first conductive layer is the lowermost layer 15B1 of titanium (Ti), the second conductive layer is the intermediate layer 15B2 of aluminum (Al), and the third conductive layer is the uppermost layer 15B3 of molybdenum (Mo). The Ti layer 15B1 is wider than the Al layer 15B2 and the Mo layer 15B3. This wider part W permits the Ti layer 15B1 to come into direct contact with the second electrode 20. The organic EL display device 1 constructed in this manner ensures good electrical connection between the second electrode 20 and the auxiliary wiring 18B through the Ti layer 15B1, which is the lowermost layer of the contact part 15B. This leads to low power consumption and improved display quality.

The lowermost layer (or Ti layer 15B1) should preferably be formed from a material which exhibits high etching selectivity for the first electrode 18A. Such a material protects the Ti layer 15B1 from etching to form the first electrode 18A. The intermediate layer (or Al layer 15B2) may be formed from AlSi alloy, AlSiCu alloy, or AlCe alloy. The uppermost layer (or Mo layer 15B3) exists only in that portion of the contact part 15B in which the auxiliary wiring 18B exists, and it does not exist where the auxiliary wiring 18B does not exist because it disappears at the time of etching for the auxiliary wiring 18B in the manufacturing process described later.

The side of the opening of the electrode insulating film 21 expands gradually upward. The opening of the electrode insulating film 21 is wider than that of the planarized insulating film 17A under which the contact part 15B is formed. As shown in FIG. 4, the second electrode 20 expands upward smoothly or stepwise. Expansion in this manner prevents wiring breakage or resistance increase that would otherwise occur when the second electrode 20 is formed. (A detailed description will be given later.) Incidentally, the electrode insulating film 21 is formed from an insulating material such as photosensitive polyimide resin.

In the organic EL element (EL) mentioned above, the second electrode 20 is uniformly coated with a protective film (not shown), and between the protective film and the transparent substrate 10B is the sealing resin 17B. The organic EL display device 1 constructed in this manner emits light upward through the second electrode 20 (close to the transparent substrate 10B) from the organic light-emitting layer 19. In other words, it is of top-emitting type.

The protective film (not shown) on the second electrode 20 is formed from an insulating material such as $SiO_2$, SiN, and SiON. The sealing resin 17B planarizes the layer structure to be supported on the transparent substrate 10B.

The thin film transistor Tr corresponds to the "driving element" in the present embodiment, the organic light-emitting layer 19 corresponds to the "light-emitting part" in the present embodiment, and the planarized insulating film 17A and the electrode insulating film 21 correspond to the "insulating film" in the present embodiment.

The organic EL display device 1 is produced by the process which is described below with reference to FIGS. 6 to 9B. FIGS. 6 to 9B are sectional views illustrating part of the process for producing the organic EL display device 1.

Figure 6:
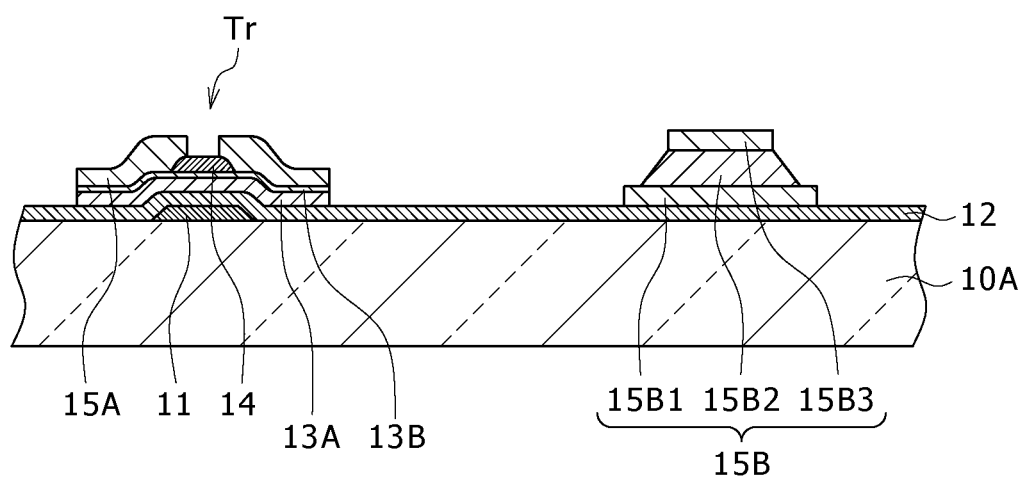
FIG. 6 is a sectional view showing a portion of the major steps of the process for producing the display device shown in FIG. 3.

In the first step shown in FIG. 6, the transparent substrate 10A formed from the material mentioned above undergoes sputtering, CVD (chemical vapor deposition), or photolithography to sequentially deposit thereon the gate electrode 11 of the material mentioned above (100 nm thick), the gate insulating film 12 (400 nm thick), the silicon film 13A (30 nm thick), the stopper insulating film (300 nm thick), the $n^+$-amorphous silicon film 13B (100 nm thick), and the wiring layer 15A (600 nm thick). In this way there are obtained thin film transistors Tr arranged in a matrix pattern.

When the wiring layer 15A is formed by, say, sputtering, the contact part 15B of the same structure as the wiring layer 15A is also formed simultaneously from the same material as used for the wiring layer 15A. The contact part 15B is formed on the gate insulating film 12 or at the same level as the wiring layer 15A in the region between the first electrodes 18A as shown in FIG. 4.

Figure 7A:
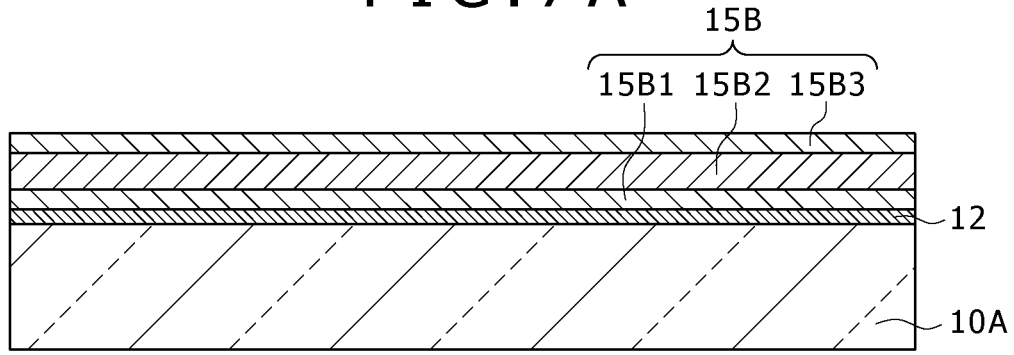
FIGS. 7A, 7B and 7C are sectional views showing steps that follow the steps shown in FIG. 6.
Figure 7B:
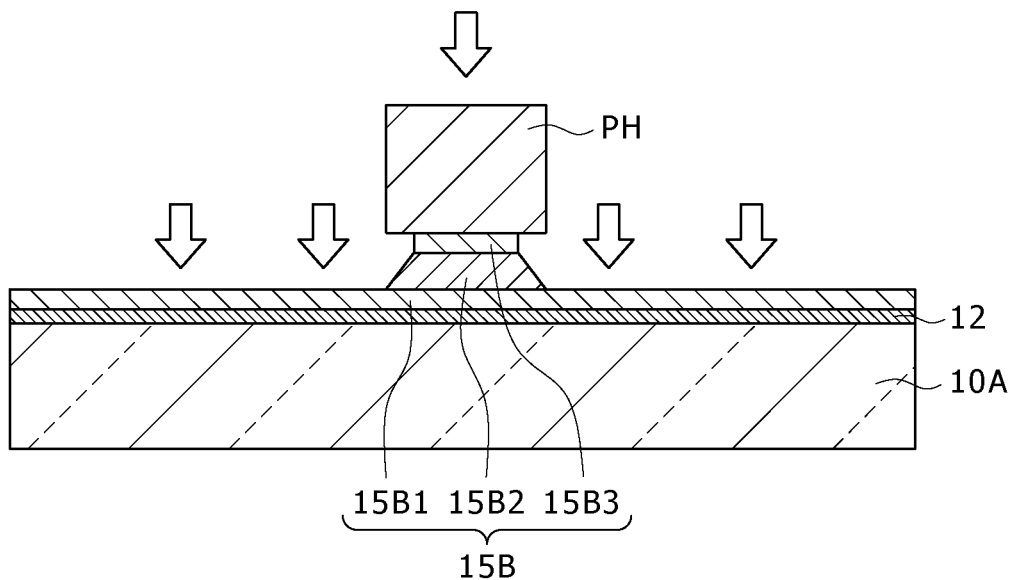
Figure 7C:
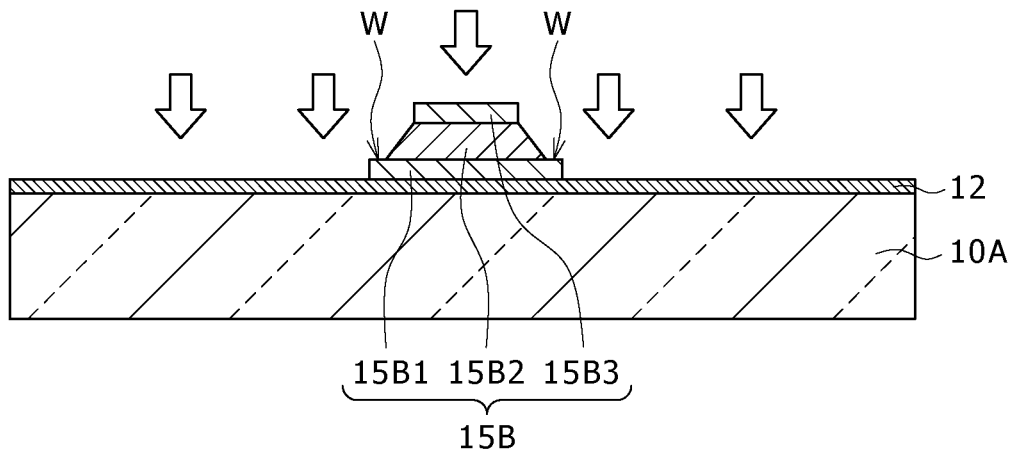

The process of forming the contact part 15B consists of the following three steps shown in FIGS. 7A, 7B and 7C. As shown in FIG. 7A, the gate insulating film 12 is coated sequentially with the Ti layer 15B1 (50 nm thick), the Al layer 15B2 (500 nm thick), and the Mo layer 15B3 (50 nm thick) by sputtering. As shown in FIG. 7B, the top layer is coated with the photoresist film (PH), which is subsequently used as a mask for wet etching with a mixture of phosphoric acid, nitric acid, and acetic acid. This etching removes the unmasked part of the Mo layer 15B3 and also selectively removes the unmasked part of the Al layer 15B2. As shown in FIG. 7C, the Ti layer 15B1 is selectively removed by dry etching with chlorine gas in such a way that its surface is partly exposed to form the wider part W as shown in FIG. 3.

The photoresist film (PH) is finally removed. In this way the contact part 15B is formed at the same level as the wiring layer 15A.

The process according to this embodiment eliminates defective patterning due to etching because it forms the contact part 15B by photolithography, wet etching (with a mixture of acids) on the Al layer 15B2, and dry etching (with chlorine gas) on the Ti layer 15B1.

In other words, the process according to this embodiment offers the advantage of reducing defective patterning due to dry etching. This advantage arises from the fact that dry etching gives a small difference between the line width of the photoresist pattern and the line width of the etched pattern. Since the Mo layer 15B3 and the Al layer 15B2, which are the uppermost and intermediate layers, undergo wet etching, whereas the Ti layer 15B1, which is the lowermost layer, undergoes dry etching, the Ti layer is wider than the Al layer as a matter of course. The Al layer 15B2 is naturally oxidized in the atmospheric air and hence becomes poor in electrical connection with the second electrode 20 through which light emerges. However, good electrical connection is maintained between the Ti layer 15B1, which is the lowermost layer, and the second electrode 20.

Incidentally, in the case where wet etching is performed on a Ti/Al/Ti laminate structure (see comparative example 2 given later), the edge of the upper Ti layer becomes unstable and breaks to give rise to foreign matter that causes defective patterning, if the Al layer has a faster etching rate than the upper Ti layer. This is because the etching rate greatly differs between Ti and Al.

Figure 8A:
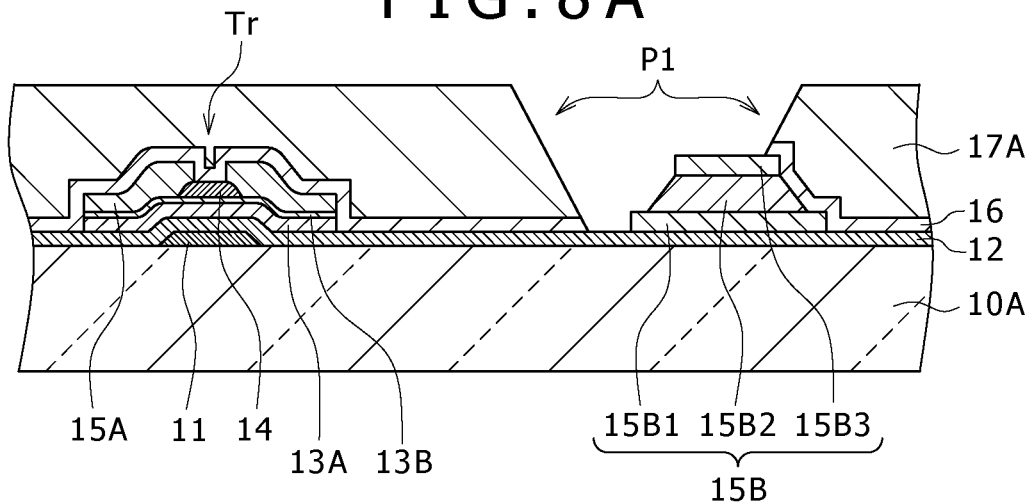
FIGS. 8A, 8B and 8C are sectional views showing steps that follow the steps shown in FIGS. 7A, 7B and 7C.
Figure 8B:
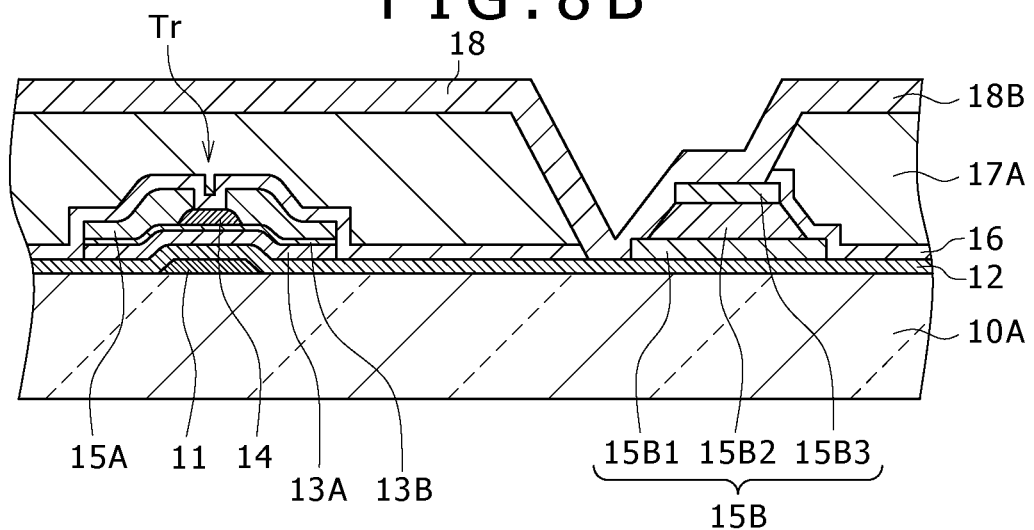
Figure 8C:
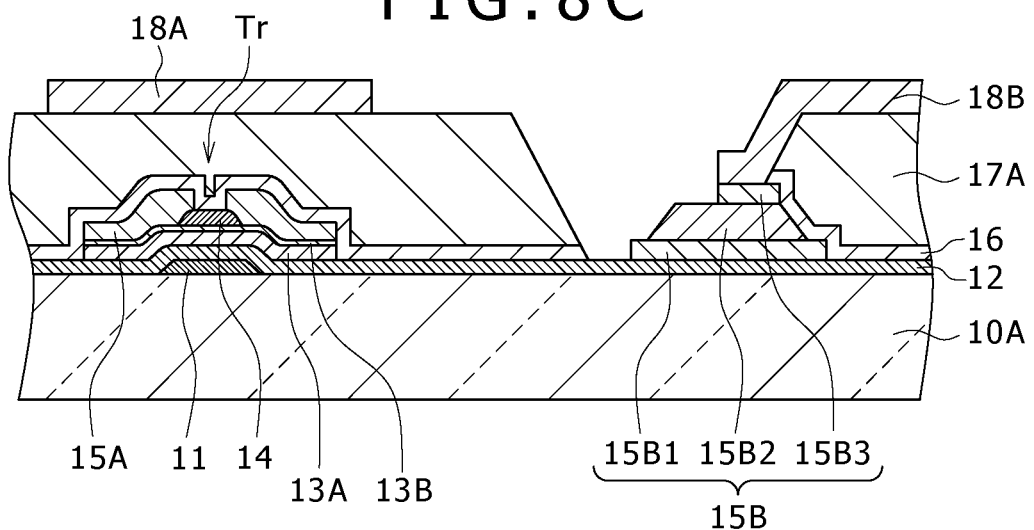

The foregoing process to form the thin film transistor Tr and the contact part 15B is followed by the next process consisting of three steps shown in FIGS. 8A to 8C.

The step shown in FIG. 8A is intended to evenly form the protective insulating film 16 (from the same material as mentioned above) by CVD on the thin film transistor Tr and the contact part 15B. Then, the protective insulating film 16 is evenly coated with the planarized insulating film 17A (of the same material as mentioned above) by spin coating or slit coating. The region corresponding to the contact part 15B undergoes photolithography for exposure and development to make an opening. After baking, there is obtained an opening with tapered sides indicated by P1 in FIG. 8A. The planarized insulating film is formed from a photosensitive resin which gives a gentle slope. The opening with a gentle slope may also be formed by using a multi-tone mask such as half-tone mask or gray-tone mask, or by performing exposure several times through several masks differing in the size of the opening. The slope of the taper may be properly established according to the thickness and forming method of the second electrode 20.

In the next step shown in FIG. 8B after the opening has been formed in the planarized insulating film 17A, the planarized film 17A and the contact part 15B are evenly coated with the metal layer 18 (about 300 nm thick) by sputtering. This metal layer 18 is formed from the same material as used for the first electrode 18A and the auxiliary wiring 18B mentioned above.

In the next step shown in FIG. 8C after the metal layer 18 has been formed, the metal layer 18 undergoes selective etching by photolithography, so that the first electrode 18A and the auxiliary wiring 18B shown in FIGS. 3 and 4 are formed. The first electrode 18A is formed at a position corresponding to the thin film transistor Tr, and the auxiliary wiring 18B is formed in the region between the first electrodes 18A. Patterning is performed in such a way that a portion of the auxiliary wiring 18B is electrically connected to the contact part 15B. It is not always necessary that the contact part 15B be formed from a material having a high etching selectivity for the metal layer 18; it may be formed from any material having a high selectivity for the conductive material. There is no possibility that the conductive material of the contact part 15B is etched altogether. An adequate etching method may be selected.

Figure 9A:
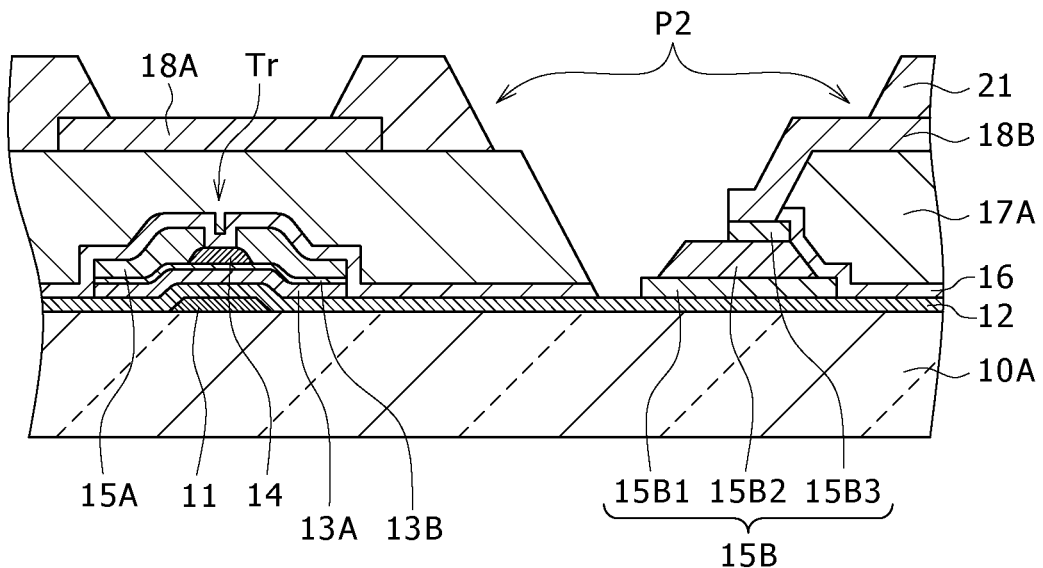
FIGS. 9A and 9B are sectional views showing steps that follow the steps shown in FIGS. 8A, 8B and 8C.

In the next step shown in FIG. 9A after the first electrode 18A and the auxiliary wiring 18B have been formed, the planarized insulating film 17A, the first electrode 18A, and the auxiliary wiring 18B are evenly coated with the electrode insulating film 21 of the same material as mentioned above by spin coating or slit coating. The coating is subsequently patterned into a desired shape by photolithography so that the first electrodes 18A and the organic light-emitting layers 19 are separated from each other. At this time, the region corresponding to the contact part 15B is selectively removed by photolithography so that the tapered opening indicated by P2 in FIG. 9A is formed. The tapered opening is formed in such a way that its slope is as gentle as possible. This object is achieved by using a multi-tone mask such as half-tone mask and gray-tone mask, or by repeating exposure several times through several masks differing in the size of the opening. The opening in the electrode insulating film 21 should have a tapered shape that opens upward.

Figure 9B:
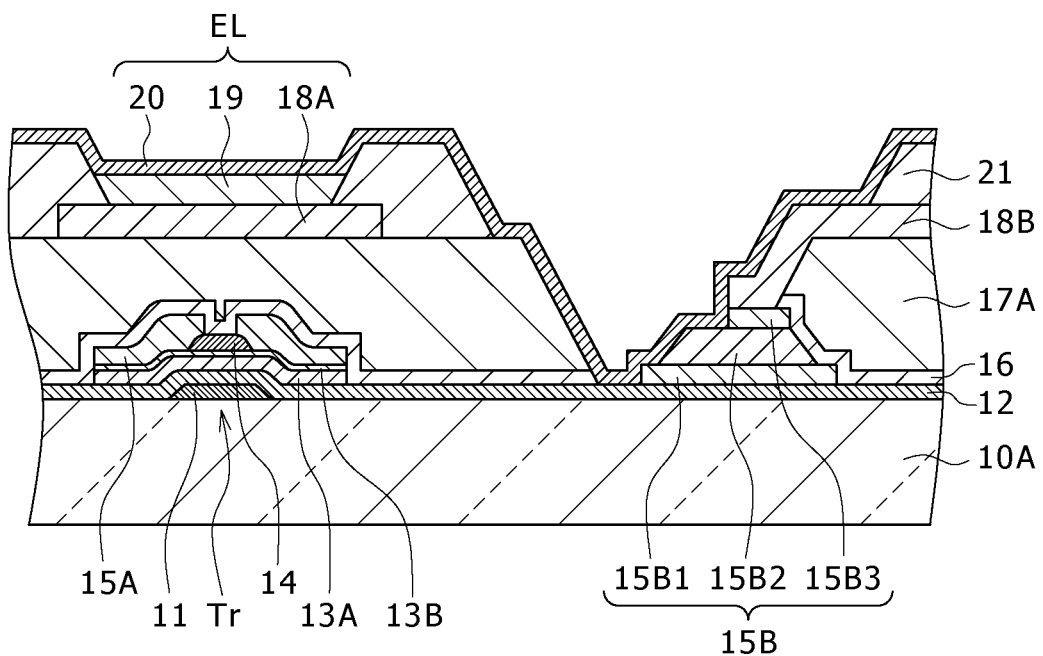

In the next step shown in FIG. 9B after the electrode insulating film 21 has been formed, the first electrode 18A is coated with the organic light-emitting layer 19 by vacuum deposition. Then, the organic light-emitting layer 19, the electrode insulating film 21, the planarized insulating film 17A, the contact part 15B, and the auxiliary wiring 18B are coated by vacuum deposition with the second electrode 20 (about 10 nm thick) of the same material as mentioned above.

Finally, the second electrode 20 is evenly coated by CVD with a protective film (not shown) of the same material as mentioned above. On the protective film (not shown) is cast the sealing resin 17B and the entire assembly is held between the transparent substrates 10B and 10A. In this way there is obtained the organic EL display device 1 (shown in FIGS. 3 and 4) as intended by the embodiment.

The organic EL display device 1 operates in the following manner. Upon application of voltage to the first electrode 18A through the wiring layer 15A and the thin film transistor Tr, the organic light-emitting layer 19 emits light with a luminance proportional to the potential across the first electrode 18A and the second electrode 20. The light from the organic light-emitting layer 19 is reflected by the first electrode 18A and passes through the second electrode 20. Thus the emitted light emerges upward (in FIG. 4) through the transparent substrate 10B. Each organic EL element (EL) in each pixel emits light in response to pixel signals, and the organic EL display device 1 displays a desired image.

The advantage of the organic EL display device 1 is as follows. The second electrode 20 and the auxiliary wiring 18B are electrically connected to each other through the conductive contact part 15B which resists surface oxidation and provides good connection (preferably ohmic connection) with the second electrode 20. Therefore, even though surface oxidation occurs in the auxiliary wiring 18B of the same material as the first electrode 18A, connection resistance does not increase between the second electrode 20 and the auxiliary wiring 18B. To be specific, the passage (P) of electrical connection is the second electrode 20→the wider part W of the lowermost Ti layer 15B1→the intermediate Al layer 15B2→the uppermost Mo layer 15B3→the auxiliary wiring 18B, as shown in FIG. 4.

Figure 10:
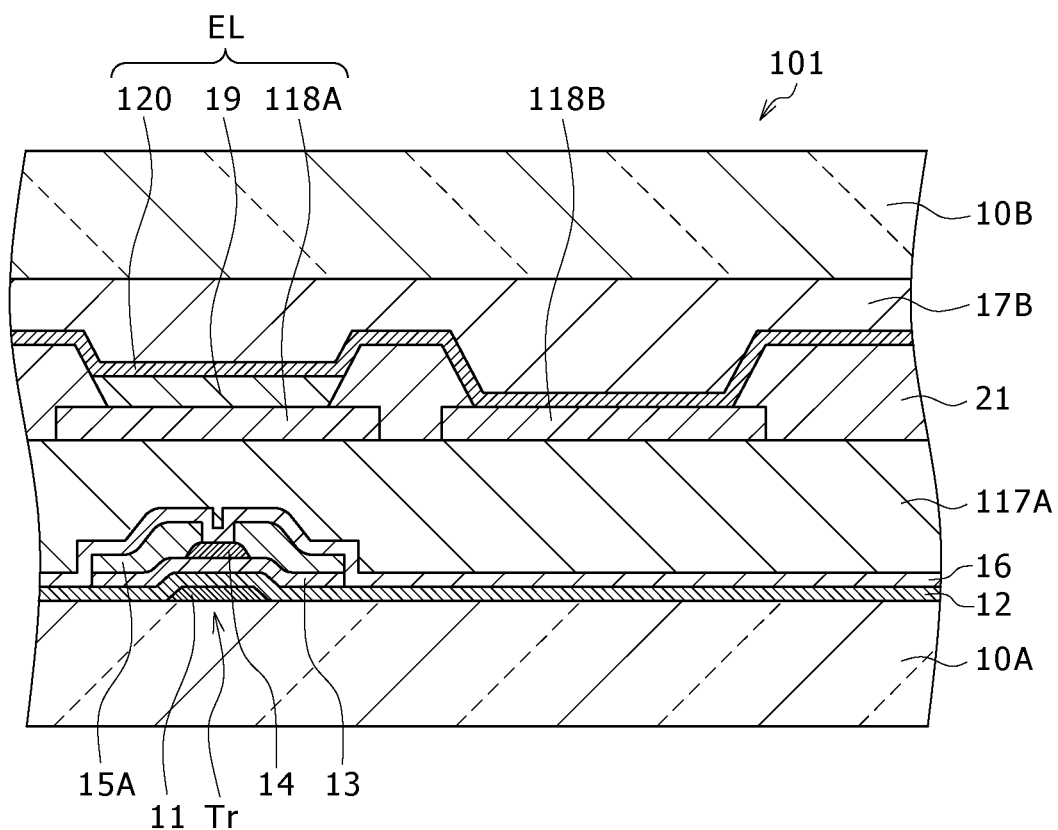
FIG. 10 is a sectional view showing the structure of the contact part in comparative example 1.

Incidentally, the existing EL display device 101 (comparative example 1) shown in FIG. 10 is that the auxiliary wiring 118B is formed from the same material as the first electrode 18A at the same level as the first electrode 18A and is directly connected to the second electrode 120. The disadvantage of this structure is that when the auxiliary wiring 118B suffers surface oxidation, the connecting resistance increases between the second electrode 120 and the auxiliary wiring 118B.

By contrast, the organic EL display device 1 of this embodiment is constructed such that the auxiliary wiring 18B is formed at the same level as the first electrode 18A and only a portion of the auxiliary wiring 18B in the region between the first electrode 18A and the auxiliary wiring 18 is connected to the contact part 15B at the same level as the wiring layer 15A. Therefore, the layout is not restricted by the thin film transistor Tr and the wiring layer 15A when the contact part 15B is formed.

As mentioned above, this embodiment is characterized in that the second electrode 20 and the auxiliary wiring 18B are electrically connected to each other through the conductive contact part 15B and only a portion of the auxiliary wiring 18B is connected to the contact part 15B. The advantage of this structure is that even though the auxiliary wiring 18B suffers surface oxidation, there is no possibility of the contact resistance increasing and the layout is not restricted when the contact part 15B is formed. This ensures free layout and low power consumption, and the resulting organic EL display device 1 has an improved display quality.

The fact that the layout is not restricted when the contact part 15B is formed leads to freedom from defects due to shorts that might occur in the wiring layer 15 because of unnatural layout.

The fact that the contact part 15B is formed from the same material as the wiring layer 15A at the same level as the wiring layer 15A is a reason why the manufacturing steps do not increase (and hence the production cost remains low) even though the contact part 15B is formed. In other words, the wiring layer 15A and the contact part 15B are formed in the same step and hence this simplifies the manufacturing process.

Moreover, the fact that the contact part 15B is formed from a material which has a higher etching ratio relative to the first electrode 18A eliminates the possibility of the contact part 15B being etched when the first electrode 18A and the auxiliary wiring 18B are formed by etching the metal layer 18. This ensures the formation of the contact part 15B.

Moreover, the fact that the planarized insulating film 17A and the electrode insulating film 21 are formed such that their sides are tapered (expanding upward) prevents the second electrode 20 from suffering breakage and increasing in resistance in the sides of the opening. This contributes to good production yields.

Moreover, this embodiment is the layered structure of the contact part 15B. That is, the contact part 15B is composed of the lowermost Ti layer 15B1 (the first conducting layer), the intermediate Al layer 15B2 (the second conducting layer), and the uppermost Mo layer 15B3. And, the Ti layer 15B1 has a wider part W which is wider than the Al layer 15B2 and the Mo layer 15B3, so that the second electrode 20 comes into direct contact with the Ti layer 15B1. The advantage of this structure is that even though the intermediate Al layer 15B2 suffers natural oxidation in the atmospheric air and electrical contact with the second electrode 20 (through which light is extracted) becomes poor, good electrical contact is still maintained between the lowermost Ti layer 15B1 and the electrode through which light emerges.

Moreover, the fact that the contact part 15B is formed by wet-etching the Mo layer 15B3 and the Al layer 15B2 with mixed acids as an etchant and then dry-etching the Ti layer 15B1 with chlorine gas reduces defective patterning due to dry etching while utilizing the advantage of dry etching that there is a small difference between the line width of photoresist pattern and the line width of etched pattern. A detailed description about this will be given later.

The Second Embodiment

The following deals with the display device pertaining to the second embodiment of the present invention. The constituents common to the first and second embodiments are given the same symbols and their explanation is not repeated.

Figure 11:
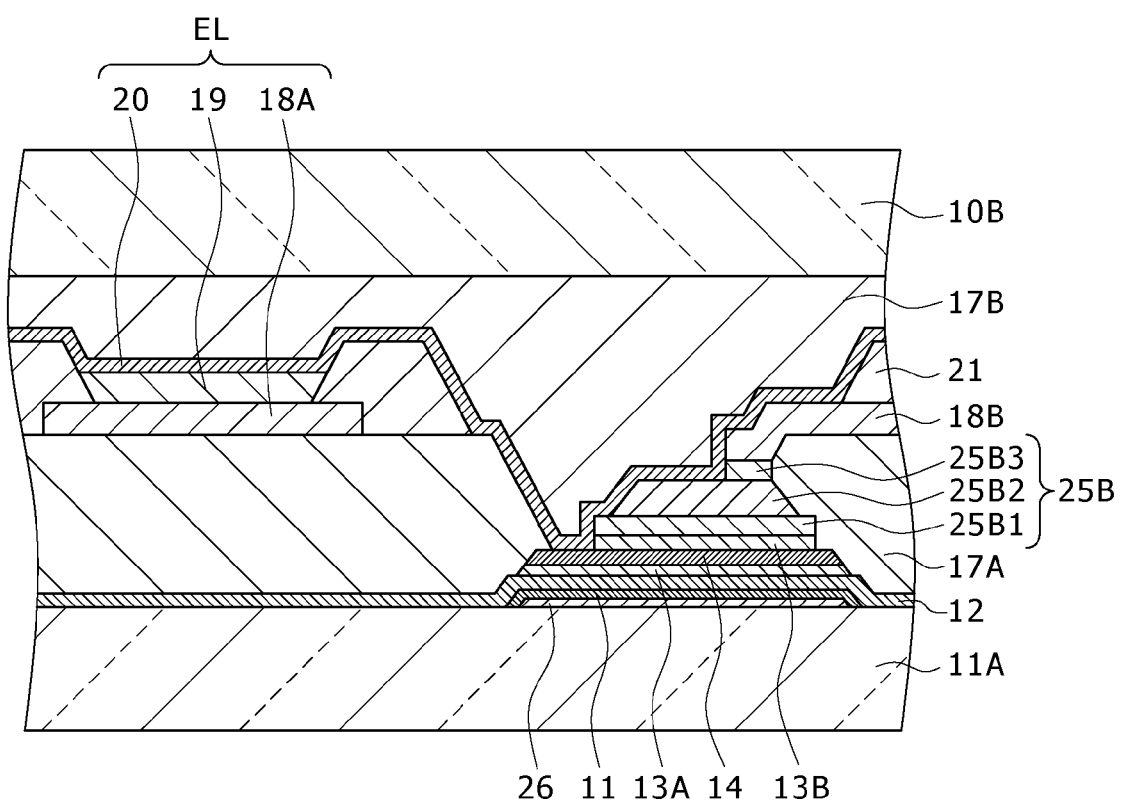
FIG. 11 is a sectional view showing the structure of the contact part of the display device pertaining to the second embodiment.

FIG. 11 is a sectional view showing the structure of the contact part 25B of the display device (organic EL display device) pertaining to this embodiment. The contact part 25B has on the transparent substrate 11A the low-resistance wiring layer 26 as the lowermost layer which is identical with the source signal line or gate wiring connected to the thin film transistor Tr. The low-resistance wiring layer 26 is 500 nm thick and has the layer identical with the gate electrode 11, the gate insulating layer 12, the silicon film 13A, the stopper insulating film 14, and the n$^+$-amorphous silicon film 13B which are sequentially formed thereon upward. The low-resistance wiring layer 26 prevents the gate wiring, the source signal line, and the current supply line from increasing in resistance in proportion to their length as the display screen becomes larger and improves in definition. Incidentally, the low-resistance wiring layer 26 is not necessary in the thin film transistor Tr, and hence it is not included in the first embodiment shown in FIGS. 5A and 5B. The second embodiment is identical in structure with the first one except for the part relating to the thin film transistor Tr and the protective insulating film 16.

This embodiment is that the low-resistance wiring layer 26 exists under the contact part 25B. This structure reduces the distance between the first electrode 18A and the second electrode 20, with the result that steps due to the planarized film become smaller and the contact resistance decreases more than that in the first embodiment and that resistance increase due to breakage is less liable to occur. Other effects of the second embodiment are identical with those of the first embodiment.

The contact parts 15B and 25B of the first and second embodiments differ from in contact resistance from those in comparative example 2 shown in FIG. 12, which is explained in the following.

Comparative Example 2

Figure 12:
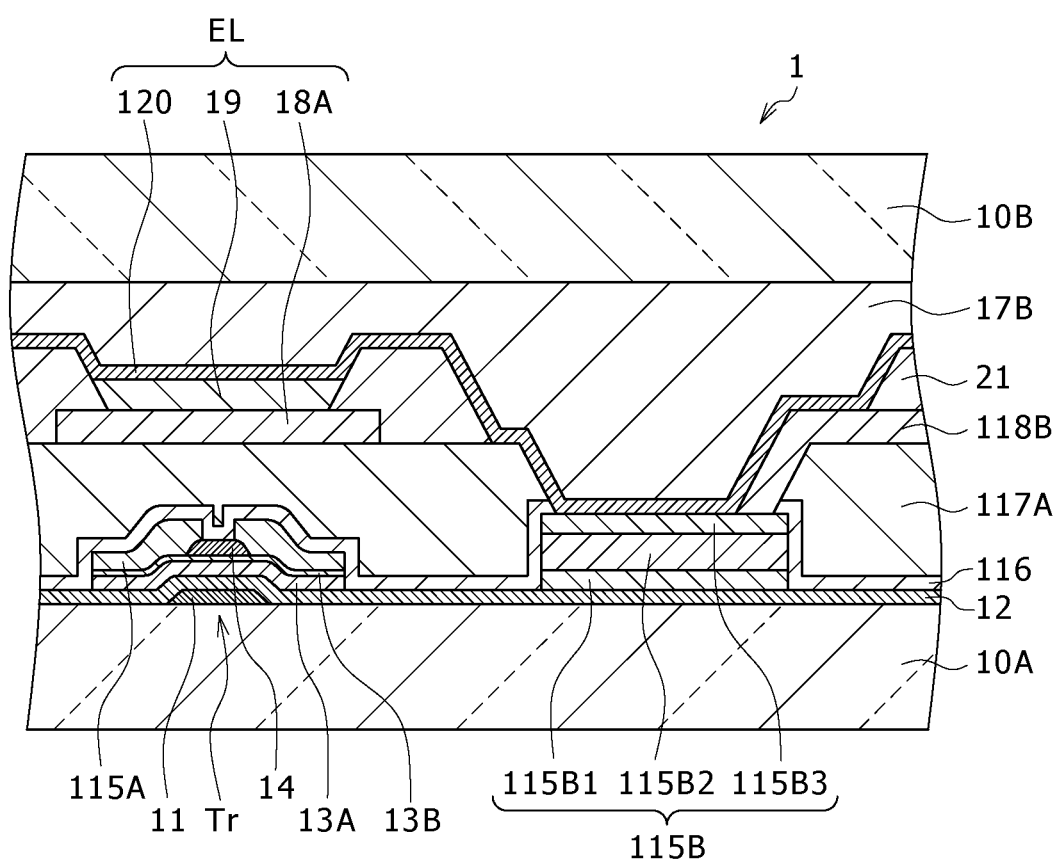
FIG. 12 is a sectional view showing the structure of the contact part in comparative example 2.

FIG. 12 is a sectional view showing the structure of the contact part 115B in comparative example 2. The contact part 115B corresponds to the contact part 15B shown in FIGS. 5A and 5B. The wiring layer 115A and the contact part 115B each have a three-layer structure composed of the Ti layer 115B3 (50 nm thick), the Al layer 115B2 (500 nm thick), the Ti layer 115B1 (50 nm thick). The second electrode 120 is placed on the protective insulating film 116 and the planarized insulating film 117A so that it is electrically connected to the upper Ti layer 115B3. Except for this structure, comparative example 2 is identical with the first and second embodiments mentioned above.

Incidentally, the structure of comparative example 2 is included in the specification attached to the application (Japanese Patent Application No. 2006-168906) filed on Jun. 19, 2006 by the present applicant. The invention of the previous application is intended to achieve good electrical connection between the auxiliary wiring 118B and the second electrode 120 (through which light emerges) by way of the contact part 115B of layered structure, with the uppermost layer being formed from Ti. Such good electrical connection is expected to raise the reflectivity of the electrode close to the driving panel and to lower the resistance of the auxiliary wiring.

Incidentally, in the case where the contact part 115B for electrical connection between the auxiliary wiring 118B and the second electrode 120 (through which light is extracted) is a layered film of Ti and Al as in comparative example 2, etching for the layered film of Ti and Al is usually accomplished by reactive etching with chlorine gas or boron trichloride gas. The reactive etching offers an advantage of giving a small difference between the line with of the photoresist pattern and the line width of the etched pattern. However, it also has a disadvantage of causing defective patterning due to foreign matter which occurs when Al undergoes etching. This disadvantage leads to low yields if the Al film is made thicker to reduce the resistance of the source signal liens and current supply lines for a larger panel and higher definition.

In addition, the contact part 115B should desirably be formed at the same level as the source-drain wiring of the thin film transistor Tr in order to simplify the manufacturing process. However, in the case of organic EL display device of top emission type, it is common practice to place a planarized layer of polyimide or acrylic resin between the source-drain layer and the pixel electrode layer constituting pixel electrodes. This planarized layer is about 2 μm thick and is formed by spin coating as in the case of photoresist. In this case, the electrode through which light emerges is connected to the contact part 115B through the contact hole formed in the planarized layer. However, connection in this manner has to get over steps of the planarized layer and this poses a problem with increase in contact resistance.

The contact resistance was evaluated in the following manner. In the case of comparative example 2, the contact part 115B is formed such that its end does not expose itself. In the case of the first and second embodiments, the contact parts 15B and 25B are formed such that the end of the Ti layer exposes itself. In all the cases, the second electrode has a contact width of 20 µm and a contact length of 100 µm. The resistance R is calculated from the voltage V which is produced by the current I of 100 µA, and the contact resistance between the first and second electrodes is measured. The results are shown in FIG. 13.

Figure 13:
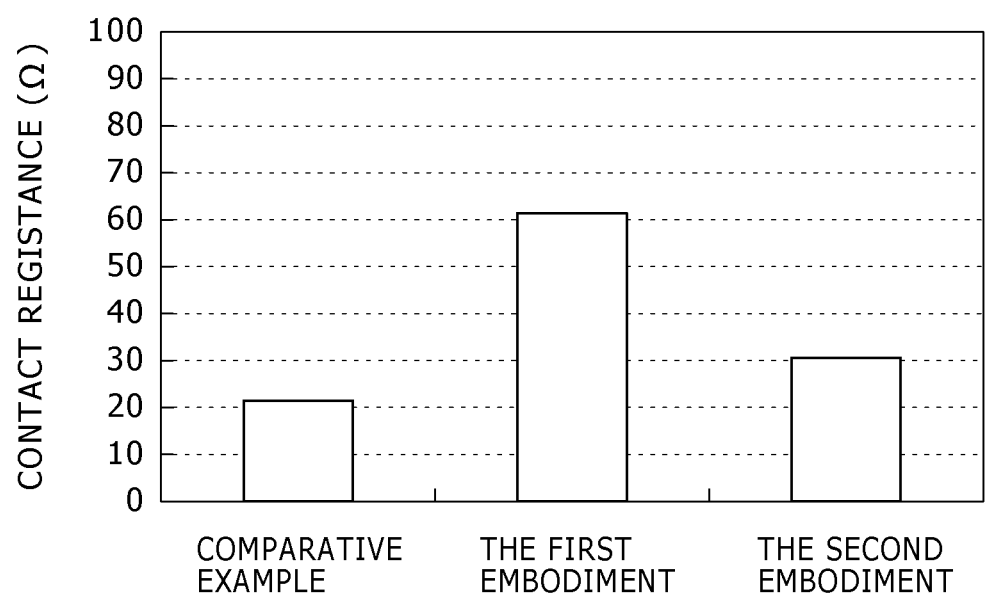
FIG. 13 is a diagram showing the results of evaluation of the contact resistance.

It is noted from FIG. 13 that the structure (according to the first embodiment) shown in FIGS. 5A and 5B has a slightly high contact resistance, whereas the structure (according to the second embodiment) shown in FIG. 11 and the structure according to comparative example 2 have almost the same contact resistance. This result suggests that the contact resistance does not substantially increase even though the above-mentioned technology is used to maintain yields in the process of forming the wiring. Incidentally, the structure (according to the first embodiment) shown in FIGS. 5A and 5B produces resistance due to connection between the contact part 15B and the auxiliary wiring 18B, but the increase in resistance is insignificant because the resistance is ohmic contact resistance.

The Third Embodiment

Figure 14:
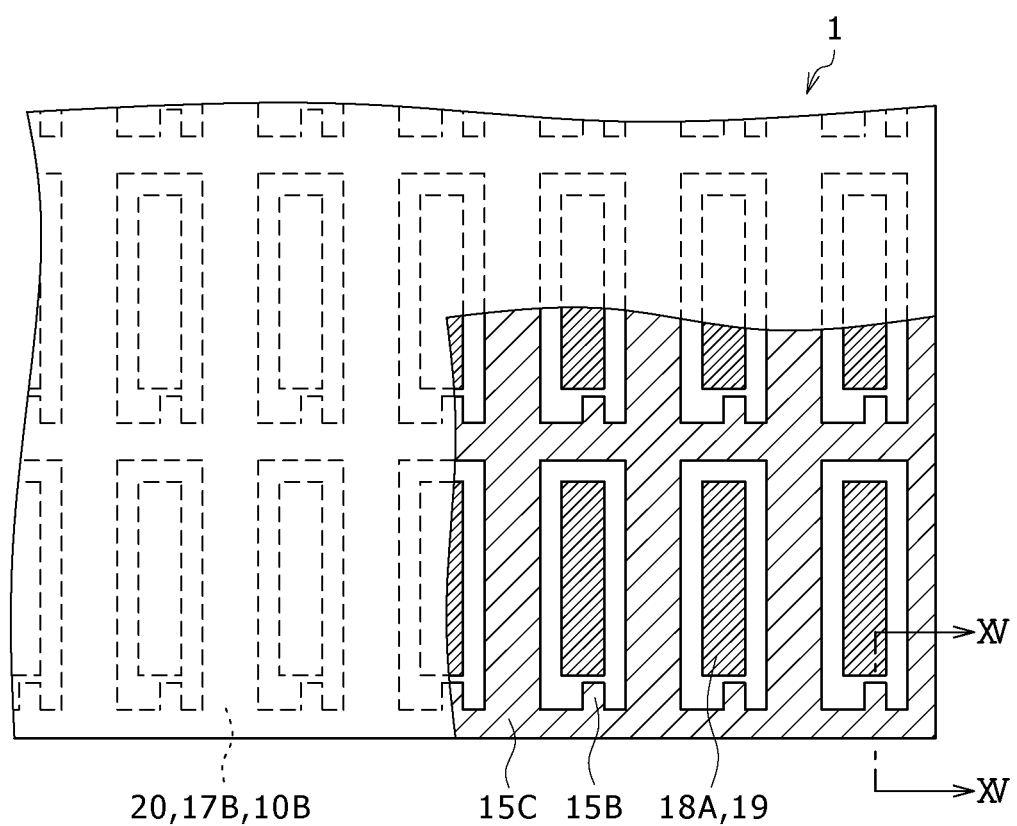
FIG. 14 is a plan view showing the structure of the display region of the display device pertaining to the third embodiment.
Figure 15:
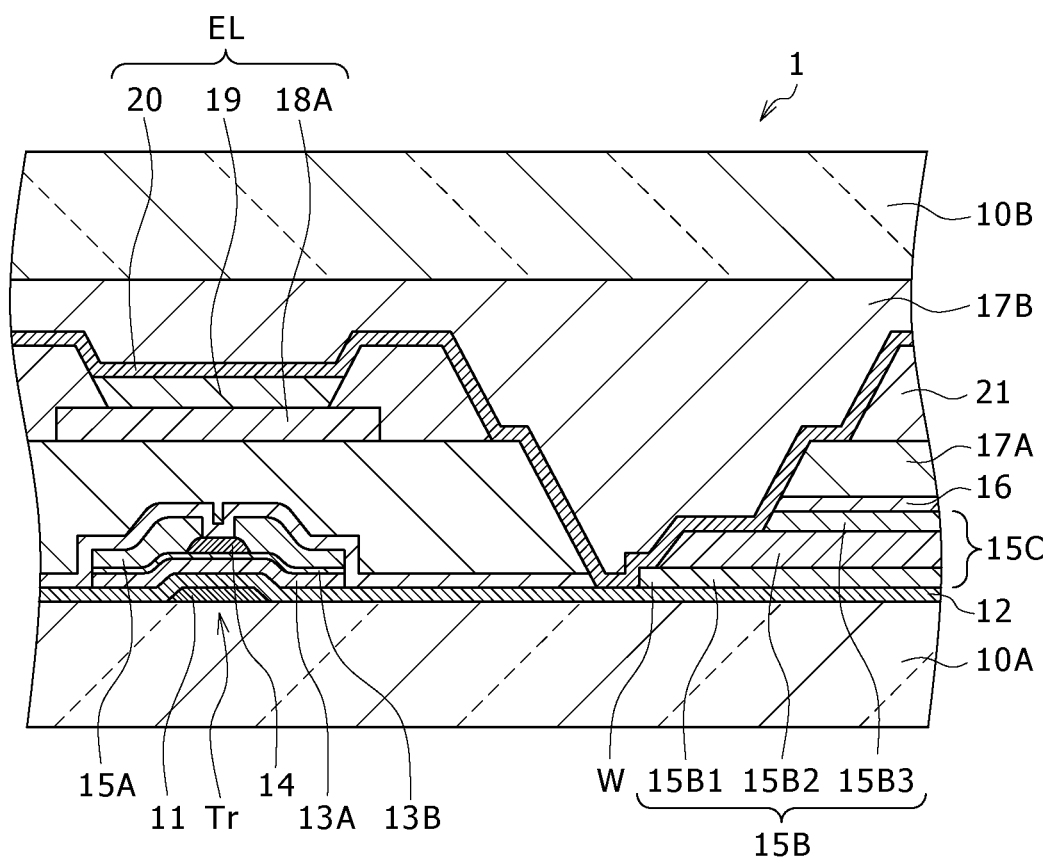
FIG. 15 is a sectional view taken along the line XV-XV in FIG. 14.

FIG. 14 is a diagram showing the plane structure of the display region 110 of the organic EL display device 1 according to the third embodiment of the present invention. FIG. 15 is a sectional view taken along the line XV-XV in FIG. 14. This organic EL display device 1 is identical in structure with the one according to the first embodiment mentioned above, except that the auxiliary wiring 15C has the same layered structure as the contact part 15B and is formed integrally with the contact part 15B. Thus, the corresponding constituents are given the same reference characters.

This embodiment is identical with the first embodiment in that the same structure is adopted for the transparent substrates 10A and 10B, the thin film transistor Tr, the wiring layer 15A, the contact part 15B, the protective insulating film 16, the planarized insulating film 17A, the electrode insulating film 21, the sealing resin 17B, and the organic EL element (EL).

Figure 16A:
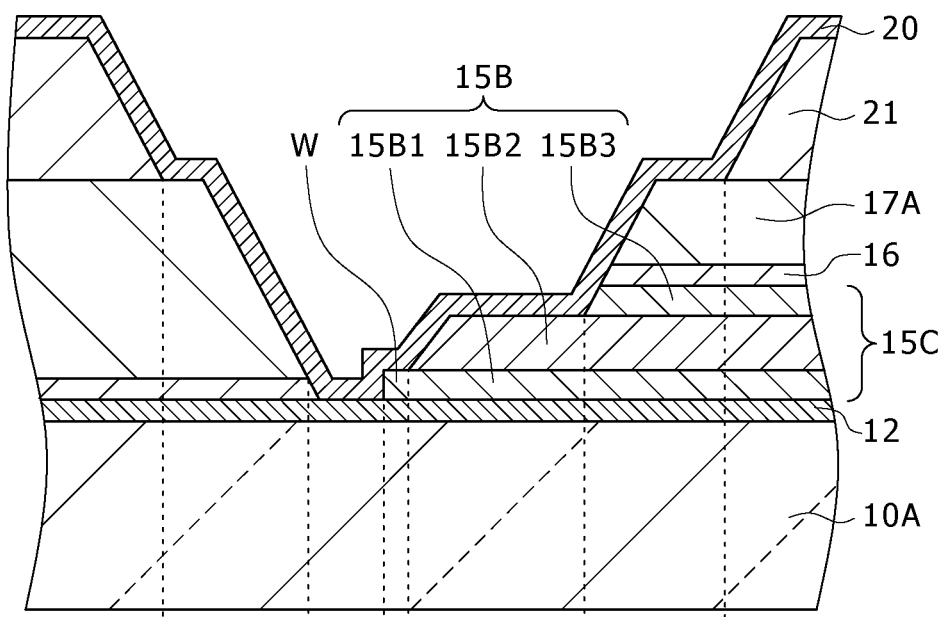
FIGS. 16A and 16B are sectional views showing the structure of the contact part in the display device shown in FIG. 15.
Figure 16B:
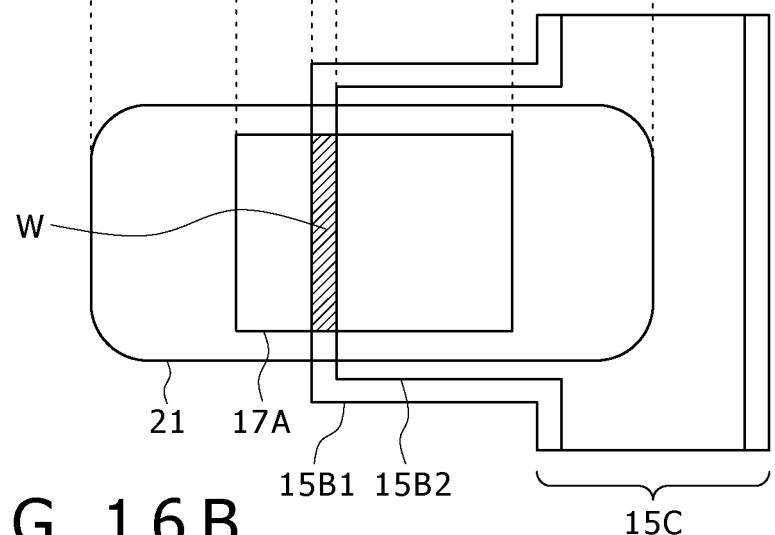

The auxiliary wiring 15C is formed in the region between the first electrodes 18A at the same level as the wiring layer 15A. Like the auxiliary wiring 18B in the first embodiment, the auxiliary wiring 15C is intended to eliminate uneven voltage distribution in the transparent second electrode 20 having a high resistance. Therefore, the auxiliary wiring 15C is so constructed as to have a lower resistance than the second electrode 20 (or it is made of a material having a low resistivity). To be specific, the auxiliary wiring 15C has the same layered structure as the contact part 15B, as shown in FIGS. 16A and 16B, and it is formed integrally with the contact part 15B. Owing to this structure, the organic EL display device 1 has a much smaller contact resistance between the auxiliary wiring 15C and the contact part 15B.

The planarized insulating film 17A and the electrode insulating film 21 have a tapered opening (expanding upward) in a portion of the region in which the auxiliary wiring 15C is formed. (See FIG. 15.) Between the bottom of the opening and the gate insulating film 12 is formed the conductive contact part 15B at the same level as the wiring layer 15A. It is on this contact part 15B that the second electrode 20 and the auxiliary wiring 15C are electrically connected to each other.

The organic EL display device 1 may be produced in the following manner.

Figure 17:
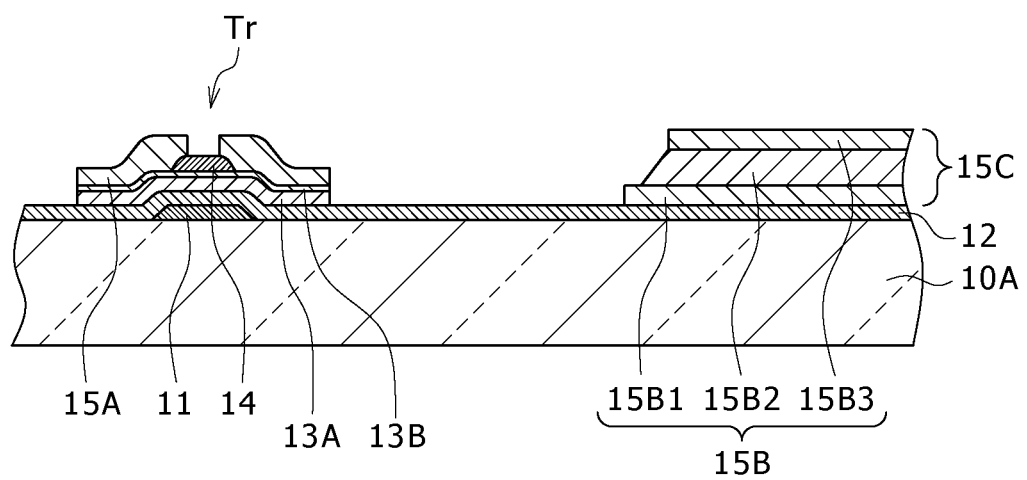
FIG. 17 is a sectional view showing a portion of the major steps of the process for producing the display device shown in FIG. 15.

First, a plurality of thin film transistors Tr are formed on the transparent substrate 10A, as shown in FIG. 17, in the same way as in the first embodiment.

The wiring layer 15A and the contact part 15B are formed simultaneously from the same material. The contact part 15B is formed on the gate insulating film 12, that is, at the same level as the wiring layer 15A, and in the region between the first electrodes 18A, as shown in FIG. 15. At this time, the auxiliary wiring 15C and the contact part 15B are formed integrally with each other.

Figure 18A:
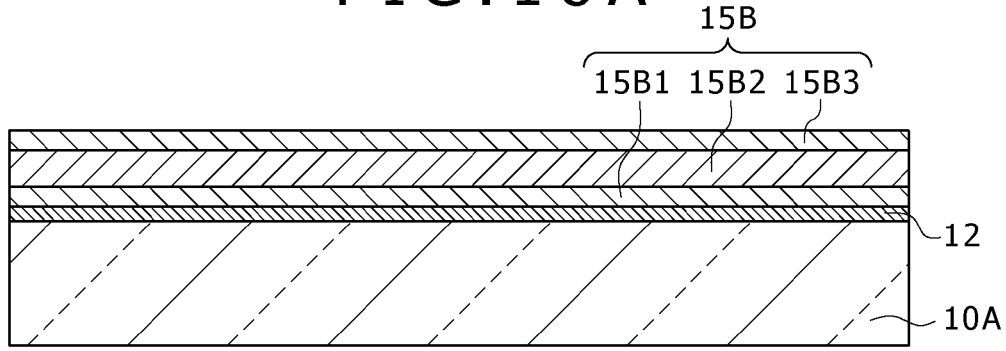
FIGS. 18A, 18B and 18C are sectional views showing steps that follow the steps shown in FIG. 17.
Figure 18B:
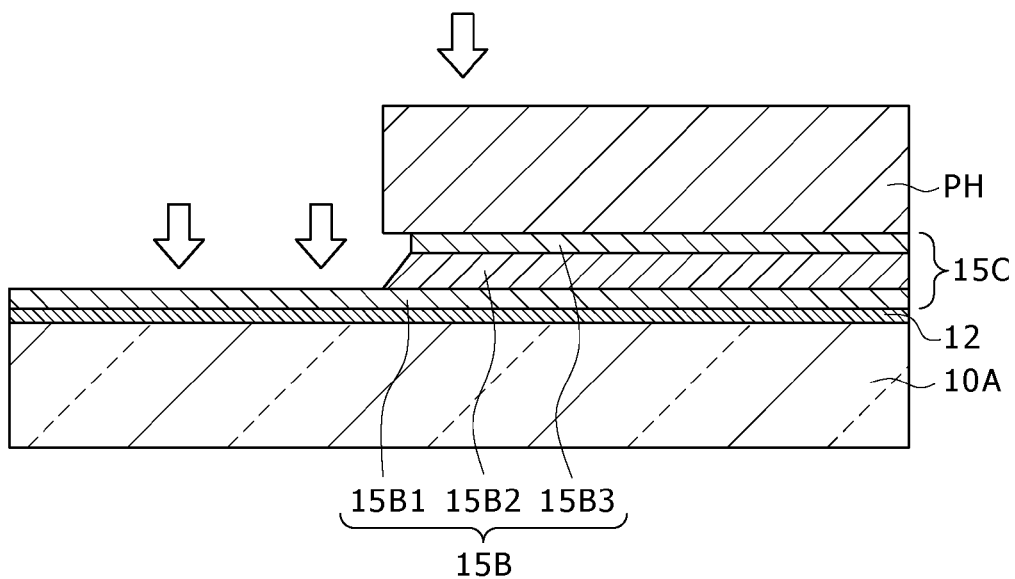
Figure 18C:
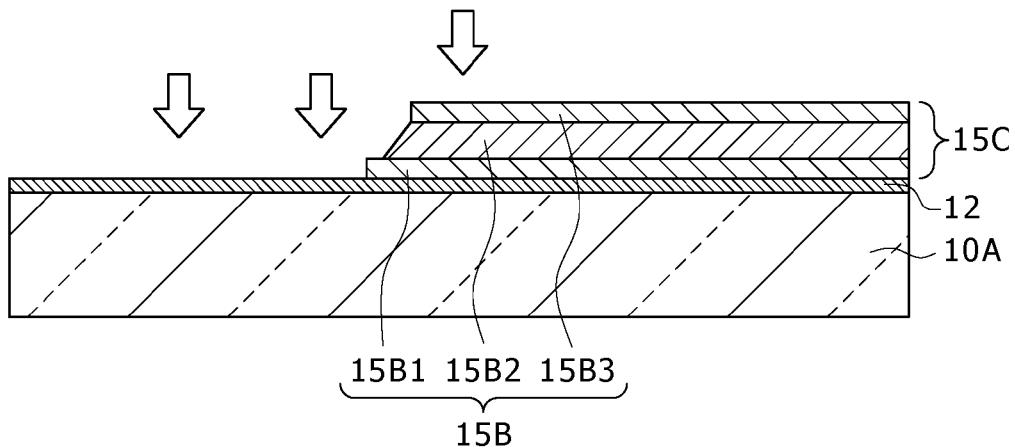

First, the gate insulating film 12 is coated by sputtering sequentially with the Ti layer 15B1 (50 nm thick), the Al layer 15B2 (500 nm thick), and the Mo layer 15B3 (50 nm thick), as shown in FIG. 18A. Next, wet etching with a mixture of phosphoric acid, acetic acid, and nitric acid is performed through the photoresist film PH as a mask to partly remove the Mo layer 15B3 and selectively remove the Al layer 15B2, as shown in FIG. 18B. Then, dry etching with chlorine gas is performed to selectively remove the Ti layer 15B1, as shown in FIG. 18C. This step makes the surface of the Ti layer 15B1 partly expose itself, thereby forming the wider part W, as shown in FIG. 15. Finally, the photoresist film PH is removed. In this way it is possible to form the contact part 15B at the same level as the wiring layer 15A and to form the auxiliary wiring 15C integrally with the contact part 15B.

The thin film transistor Tr, the contact part 15B, and the auxiliary wiring 15C, which have been formed as mentioned above, are coated with the protective insulating film 16 and the planarized insulating film 17A as shown in FIG. 19A in the same way as in the first embodiment, so that the tapered opening (indicated by P1) is formed.

The planarized insulating film 17A (with an opening formed therein) and the contact part 15B are coated with the metal layer 18 in the same way as in the first embodiment, as shown in FIG. 19B. Then, the metal layer 18 undergoes selective etching by photolithography, so that the first electrode 18A (corresponding to each thin film transistor Tr) is formed as shown in FIG. 19C.

Figure 20A:
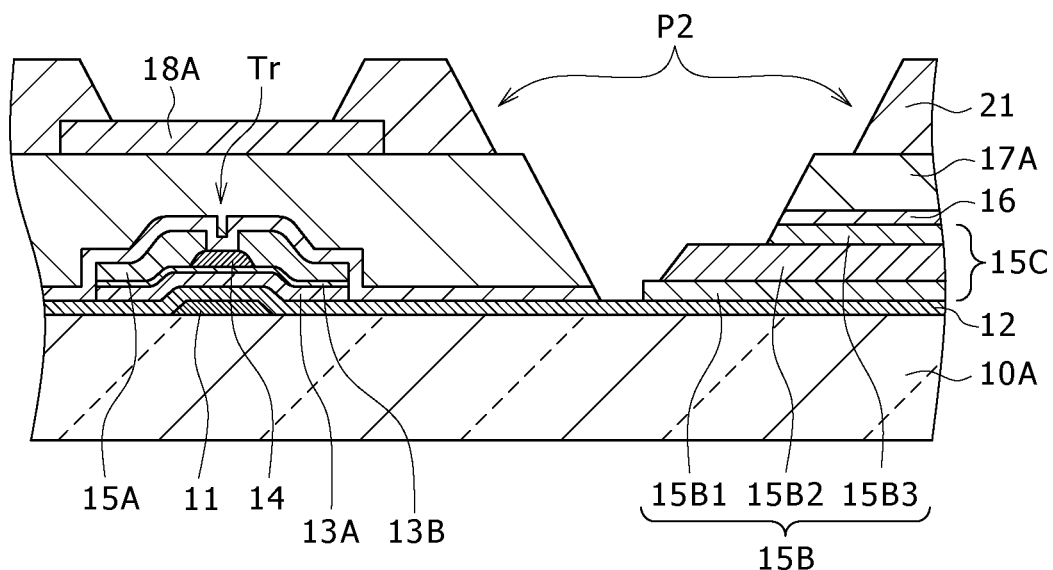
FIGS. 20A and 20B are sectional views showing steps that follow the steps shown in FIGS. 19A, 19B and 19C.

After the first electrode 18A has been formed, the electrode insulating film 21 is formed on the planarized insulating film 17A and the first electrode 18A as shown in FIG. 20A in the same way as in the first embodiment.

Figure 20B:
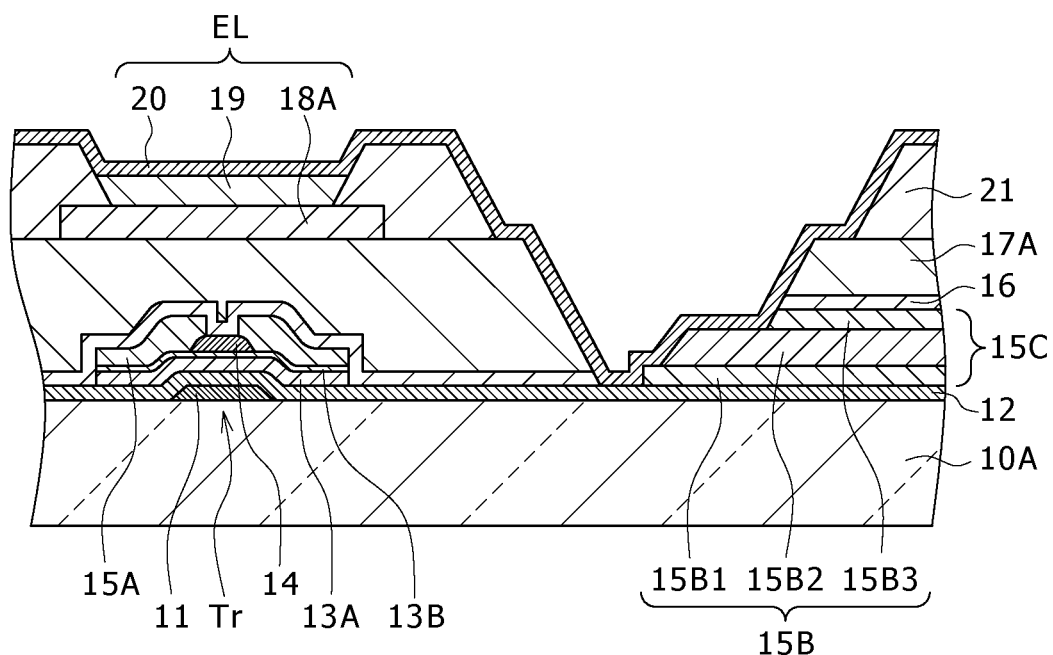

After the electrode insulating film 21 has been formed, the first electrode 18A is coated with the organic light-emitting layer 19 by vacuum deposition, as shown in FIG. 20B. Then, the second electrode 20 (about 10 nm thick) is evenly formed by vacuum deposition on the organic light-emitting layer 19, the electrode insulating film 21, the planarized insulating film 17A, and the contact part 15B.

Finally, the second electrode 20 is evenly coated by CVD with a protective film (not shown). The protective film (not shown) is evenly coated by drop injection with the sealing resin 17B, so that the above-mentioned constituents are held between the transparent substrates 10A and 10B. In this way there is obtained the organic EL display device 1 according to this embodiment as shown in FIGS. 14 and 15.

Figure 21:
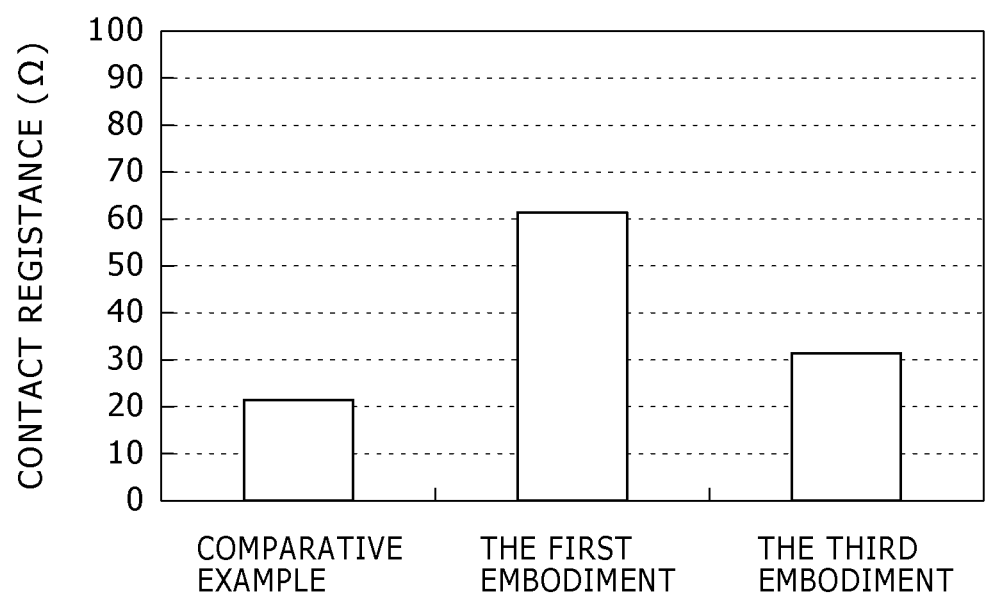
FIG. 21 is a diagram showing the results of evaluation of the contact resistance.

The organic EL display device 1 produced by the above-mentioned process was tested for contact resistance between the first and second electrodes in the same way as in the second embodiment. The results of the test are shown in FIG. 21. It is noted that the identical results are obtained from the structure shown in FIGS. 16A and 16B (the third embodiment) and the structure shown in FIG. 11 (the second embodiment). In other words, the auxiliary wiring 15C which has the same laminate structure as the contact part 15B and is formed integrally with the contact part 15B further reduces contact resistance between the auxiliary wiring 15C and the contact part 15B and prevents the contact resistance from substantially increasing.

This organic EL display device 1 operates in the same way as the one according to the first embodiment. That is, upon application of voltage to the first electrode 18A through the wiring layer 15A and the thin film transistor Tr, the organic light-emitting layer 19 emits light with a luminance proportional to electric potential difference between the first electrode 18A and the second electrode 20. Light from the organic light-emitting layer 19 is reflected by the first electrode 18A and then passes through the second electrode 19. Therefore, it emerges upward from the transparent substrate 10B shown in FIG. 4. Thus, the organic EL element (EL) in each pixel, which emits light in response to pixel signals, produces a desired image in the organic EL display device.

This organic EL display device 1 is constructed such that the auxiliary wiring 15C has the same laminate structure as the contact part 15B and is formed integrally with the contact part 15B. Therefore, it has a much smaller contact resistance between the auxiliary wiring 15C and the contact part 15B. This leads to a further reduction of contact resistance between the second electrode 20 and the auxiliary wiring 15C.

As mentioned above, the third embodiment produces not only the same effect as the first embodiment but also the effect of further reducing contact resistance between the auxiliary wiring 15C and the contact part 15B, the latter effect being due to the fact that the auxiliary wiring 15C has the same laminate structure as the contact part 15B and is formed integrally with the contact part 15B. This leads to further reduction of contact resistance between the auxiliary wiring 15C and the contact part 15B, which contributes to low power consumption and improved display quality.

MODULE AND APPLICATION EXAMPLES

The display device according to the above-mentioned embodiments can be used in various forms for television sets, digital cameras, notebook personal computers, portable telephones, video cameras, etc. which are equipped with a display device to produce images from external or internal signals.

Module

Figure 22:
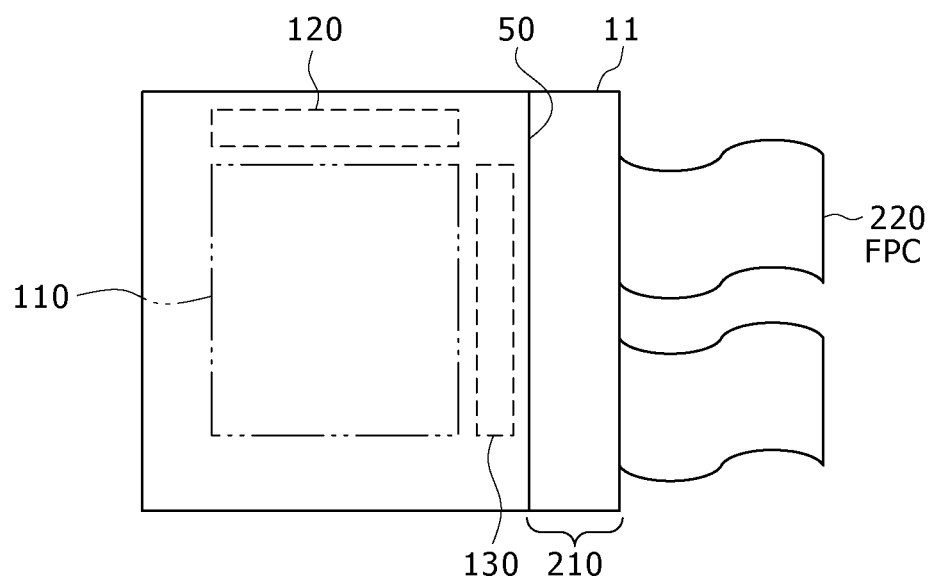
FIG. 22 is a schematic plan view showing the structure of the module including the display device pertaining to the above-mentioned embodiment.

The display device according to any of the above-mentioned embodiments may be used in the form of module shown in FIG. 22 which is built into various electronic devices listed in the following application examples. The module shown in FIG. 22 is composed of a substrate 11, a sealing substrate 50, an adhesive layer 40, and a region 210 extending from the sealing substrate 50 and the adhesive layer 40. The region 210 contains a wiring for the signal line driving circuit 120 and the scan line driving circuit 130, the wiring having an external terminal (not shown) being connected to a flexible printed circuit 220 for signal input and output.

Application Example 1

Figure 23:
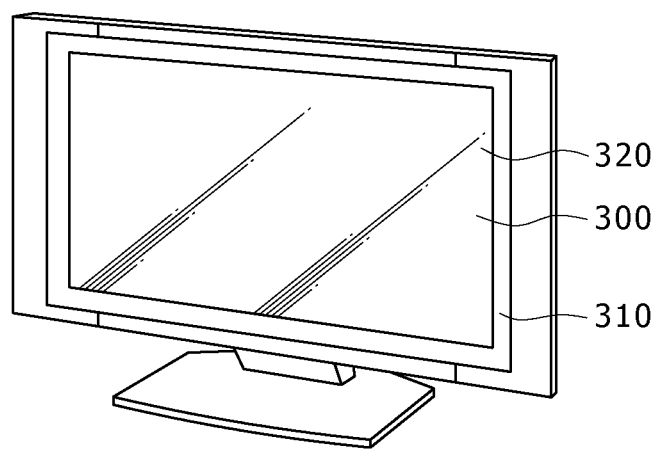
FIG. 23 is a perspective view showing an external appearance of application example 1 of the display device pertaining to the above-mentioned embodiment.

FIG. 23 is an external view showing a television set to which is applied the display device of the above-mentioned embodiments. This television set has an image display screen 300 including a front panel 310 and a filter glass 320. The image display screen 300 is based on the display device according to the above-mentioned embodiments.

Application Example 2

Figure 24A:
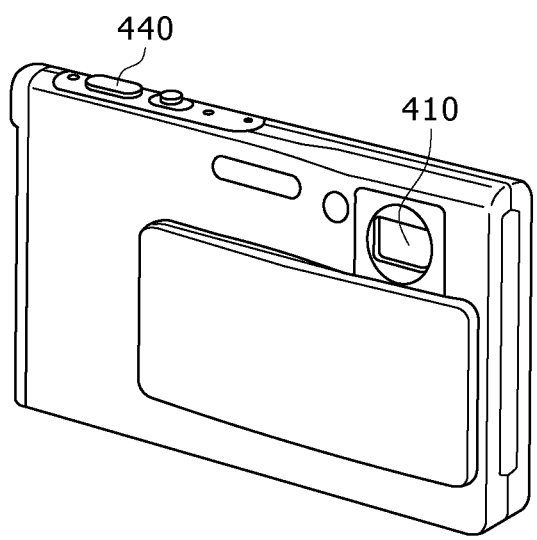
FIGS. 24A and 24B are perspective views each showing an external appearance of the front side and rear side of application example 2.
Figure 24B:
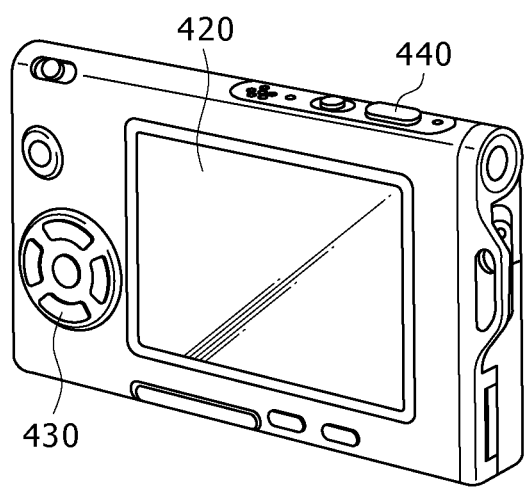

FIGS. 24A and 24B is an external views showing a digital camera to which is applied the display device of the above-mentioned embodiments. This digital camera has an illuminator 410, a display unit 420, a menu switch 430, and a shutter button 440. The display unit 420 is based on the display device according to the above-mentioned embodiments.

Application Example 3

Figure 25:
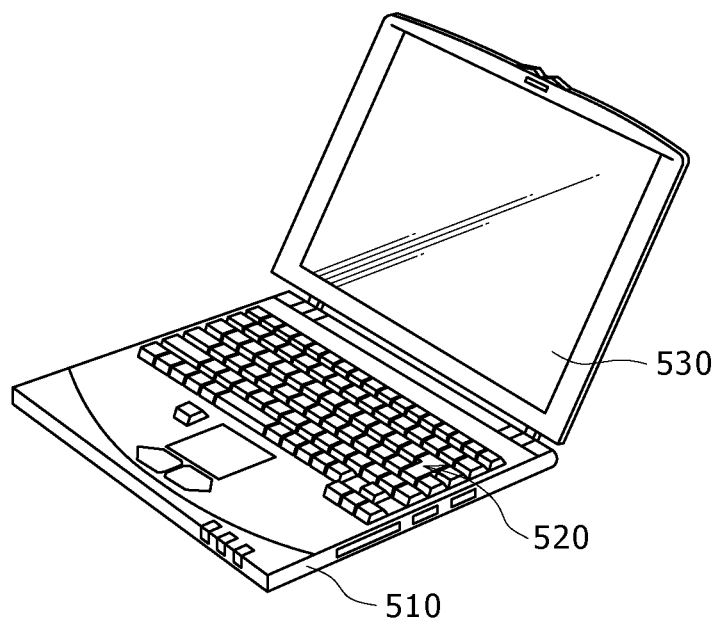
FIG. 25 is a perspective view showing an external appearance of application example 3.

FIG. 25 is an external view showing a notebook personal computer to which is applied the display device of the above-mentioned embodiments. This personal computer has a main body 510, a keyboard 520 for input operation, and a display unit 530 for image display. The display unit 530 is based on the display device according to the above-mentioned embodiments.

Application Example 4

Figure 26:
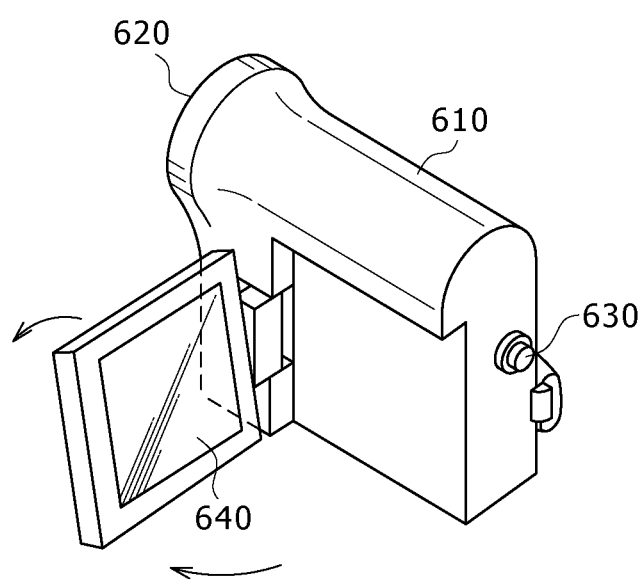
FIG. 26 is a perspective view showing an external appearance of application example 4.

FIG. 26 is an external view showing a video camera to which is applied the display device of the above-mentioned embodiments. This video camera has a main body 610, a lens 620 attached to the main body 610, a start/stop switch 630, and a display unit 640. The display unit 640 is based on the display device according to the above-mentioned embodiments.

Application Example 5

FIGS. 27A to 27G are external views showing portable telephones to which is applied the display device of the above-mentioned embodiments. This portable telephone is composed of an upper enclosure 710 and a lower enclosure 720, which are joined together with a hinge 730. It has a display 740, a subdisplay 750, a picture light 760, and a camera 770. The display unit 740 or the subdisplay 750 is based on the display device according to the above-mentioned embodiments.

The present invention has been described above with reference to the specific embodiments. However, it may be variously changed and modified without restrictions within the scope thereof.

For example, the contact part 15B or 25B may be formed at the level of other layers than the wiring layer 15A or the first electrode 18A and the auxiliary wiring 18B, shown in FIG. 4.

In the first embodiment, the auxiliary wiring 18B is formed at the same level as the first electrode 18A, and in the third embodiment, the auxiliary wiring 15C is formed at the same level as the wiring layer 15A and the contact part 15B. However, the auxiliary wiring 18B or 15C may also be formed at the level of either layer. In addition, the auxiliary wiring 18B and 15C may be in combination and may be connected to each other through contact holes, so that when one auxiliary wiring breaks, the broken one is backed up by the other one.

In the above-mentioned embodiments, the electrode insulating film 21 has an opening (corresponding to the contact part 15B) which is wider than that of the planarized insulting film 17A thereunder. However, the opening of the electrode insulating film 21 may be narrower than that of the planarized insulating film 17A so long as it has an upwardly expanding tapered shape.

In the above-mentioned embodiments, if the planarized insulating film 17A and the protective insulating film 16 are formed separately, it is desirable that the planarized insulating film 17A be placed inside the protective insulating film 16 of the contact part 15B. However, this is not necessarily limitative.

In the second embodiment, all the films formed in the steps of forming the thin film transistor Tr are left as the lower layers of the contact part 15B; however, it is not always necessary to leave all the films but some films may be removed, or an additional film separate from the thin film transistor Tr may be formed.

The display device according to the present embodiment may include not only the organic EL display device with an organic EL element as explained in the foregoing embodiments but also any other display devices.

The constituents in the foregoing embodiments are not restricted in material, thickness, forming process, and forming conditions to those specified above.

The organic EL display device 1 according to the foregoing embodiments is not always required to have all the layers mentioned above. In addition, it may also have an additional layer, such as a color filter layer attached to the transparent substrate 10B.

It should be understood by those skilled in the art that various modifications, combinations, sub-combinations and alterations may occur depending on design requirements and other factors insofar as they are within the scope of the appended claims or the equivalents thereof.

What is claimed is:

1. A display device having (a) a plurality of driving elements and (b) wiring parts electrically connected to said driving elements, the display device comprising:
   a plurality of first electrodes respectively corresponding to each driving element on said driving elements and said wiring parts;
   a plurality of light-emitting parts on said first electrodes;
   a common second electrode, comprising a material that transmits light from said light-emitting part, said common second electrode on said light-emitting parts;
   auxiliary wiring parts formed at the same depth level of the first electrodes and in a region between the first electrodes, the auxiliary wiring parts having a lower resistance than said second electrode; and
   contact parts in a laminate structure including a plurality of conductive layers, the contact parts electrically connect said second electrode and said auxiliary wirings,
   wherein,
      at least the lowermost conductive layer of said conductive layers of said contact parts being in direct contact with said second electrode, and
      the uppermost conductive layer of said conductive layers of said contact parts is in contact with said auxiliary wiring part.

2. The display device as defined in claim 1, wherein:
   said auxiliary wiring parts are formed in the region between said first electrodes from the same material as said first electrodes.

3. The display device as defined in claim 1, wherein said wiring parts have the same laminate structure as said contact parts and are formed integrally with said contact parts.

4. The display device as defined in claim 1, wherein said contact parts are of double-layered structure having the second conductive layer on the first conductive layer, and the first conductive layer is wider than the second conductive layer, and the second electrode is in contact with the wider part.

5. The display device as defined in claim 4, wherein said first conductive layer is a metal layer of any of Ti, TiN, Al, Mo, W, Cr, Au, Pt, Cu, ITO, IZO, Ag, and alloys thereof.

6. The display device as defined in claim 5, wherein said second conductive layer is a metal layer of Al.

7. The display device as defined in claim 1, wherein said contact part is formed from the same layer as the wiring part of said driving elements.

8. The display device as defined in claim 7, wherein an insulating film close to said driving elements and a film including a metal film are formed under said contact part.

9. The display device as defined in claim 7, wherein:
   an insulating layer having an opening in the region corresponding to said contact part is formed between said contact part and said second electrode, and
   said opening is formed in an upwardly expanding tapered shape.

10. The display device as defined in claim 1, wherein the lowermost conductive layer of the conductive layers of said contact parts is formed from a material which exhibits a high etching selectivity for said first electrode.

11. The display device as defined in claim 1, wherein the contact parts which are formed in the laminate structure from the plurality of conductive layers comprises a three-layered structure composed of a first conductive layer, a second conductive layer, and a third conductive layer.

12. The display device as defined in claim 11, wherein the first conductive layer is a lowermost layer of titanium (Ti), the second conductive layer is an intermediate layer of aluminum (Al), and the third conductive layer is an uppermost layer of molybdenum (Mo).

13. The display device as defined in claim 12, wherein the first conductive layer is wider than the second conductive layer and the third conductive layer.

* * * * *